US011158610B2

(12) United States Patent
Jeon et al.

(10) Patent No.: US 11,158,610 B2
(45) Date of Patent: Oct. 26, 2021

(54) DISPLAY DEVICE USING SEMICONDUCTOR LIGHT EMITTING ELEMENT, AND MANUFACTURING METHOD THEREFOR

(71) Applicant: LG ELECTRONICS INC., Seoul (KR)

(72) Inventors: Kiseong Jeon, Seoul (KR); Jinhong Park, Seoul (KR); Changseo Park, Seoul (KR); Hwankuk Yuh, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/482,971

(22) PCT Filed: Apr. 25, 2017

(86) PCT No.: PCT/KR2017/004385
§ 371 (c)(1),
(2) Date: Aug. 1, 2019

(87) PCT Pub. No.: WO2018/143514
PCT Pub. Date: Aug. 9, 2018

(65) Prior Publication Data
US 2020/0235077 A1    Jul. 23, 2020

(30) Foreign Application Priority Data
Feb. 1, 2017    (KR) .................... 10-2017-0014510

(51) Int. Cl.
*H01L 33/38*    (2010.01)
*H01L 27/32*    (2006.01)
(Continued)

(52) U.S. Cl.
CPC .......... *H01L 25/0753* (2013.01); *H01L 22/12* (2013.01); *H01L 27/3225* (2013.01);
(Continued)

(58) Field of Classification Search
CPC ......... H01L 27/15–156; H01L 27/3225–3234; H01L 51/0032–0095; H01L 51/50–56;
(Continued)

(56) References Cited

U.S. PATENT DOCUMENTS 6,121,635 A * 9/2000 Watanabe ............. H01L 33/145
257/102
7,402,467 B1 * 7/2008 Kadono .............. H01L 27/1214
438/151
(Continued)

FOREIGN PATENT DOCUMENTS

JP          5126875 B2    1/2013
KR       10-0759896 B1    9/2007
(Continued)

*Primary Examiner* — Maliheh Malek
(74) *Attorney, Agent, or Firm* — Birch, Stewart, Kolasch & Birch, LLP

(57) ABSTRACT

The present invention relates to a display device and, more particularly, to a display device using a semiconductor light emitting element. The display device according to the present invention comprises: a substrate including a plurality of metal pads; and a green semiconductor light emitting element and a blue semiconductor light emitting element, which are electrically connected to the metal pads through self-assembly, wherein the green semiconductor light emitting element and the blue semiconductor light emitting element include identification parts having different shapes so as to be distinguishable from each other when connected to the substrate.

10 Claims, 16 Drawing Sheets

(51) Int. Cl.
  *H01L 51/50*     (2006.01)
  *H01L 25/075*    (2006.01)
  *H01L 21/66*     (2006.01)
  *H01L 33/20*     (2010.01)
  *H01L 33/44*     (2010.01)
  *H01L 33/62*     (2010.01)

(52) U.S. Cl.
  CPC .............. *H01L 33/20* (2013.01); *H01L 33/38* (2013.01); *H01L 33/44* (2013.01); *H01L 33/62* (2013.01); *H01L 51/50* (2013.01); *B32B 2457/206* (2013.01)

(58) Field of Classification Search
  CPC ......... H01L 27/32–3297; H01L 2251/50–568; H01L 33/58–60; H01L 2933/0058; B32B 2457/206
  See application file for complete search history.

(56) References Cited

U.S. PATENT DOCUMENTS

| | | | | |
|---|---|---|---|---|
| 7,723,733 | B2* | 5/2010 | Daniels | F21K 9/00 257/80 |
| 7,906,788 | B2* | 3/2011 | Nagai | H01L 25/0753 257/88 |
| 8,530,910 | B2* | 9/2013 | Song | H01L 27/326 257/88 |
| 8,552,633 | B2* | 10/2013 | Hong | H01L 27/3216 313/498 |
| 8,816,331 | B2* | 8/2014 | Choi | H01L 27/326 257/40 |
| 9,704,926 | B2* | 7/2017 | Kim | H01L 51/525 |
| 10,243,123 | B2* | 3/2019 | Yoo | H01L 33/32 |
| 10,446,616 | B2* | 10/2019 | Kim | H01L 51/5218 |
| 10,707,449 | B2* | 7/2020 | Shu | H01L 27/3244 |
| 10,741,788 | B2* | 8/2020 | Won | H01L 51/5256 |
| 2002/0179908 | A1* | 12/2002 | Arao | H01L 27/088 257/72 |
| 2006/0001362 | A1* | 1/2006 | Han | H01L 51/5284 313/504 |
| 2006/0170339 | A1* | 8/2006 | Kanno | H01L 51/56 313/506 |
| 2006/0276096 | A1* | 12/2006 | Wang | H01L 51/0024 445/2 |
| 2007/0215273 | A1* | 9/2007 | Jacobs | H01L 24/31 156/297 |
| 2008/0124634 | A1* | 5/2008 | Lee | G02B 5/201 430/7 |
| 2008/0218070 | A1* | 9/2008 | Kobayashi | H01L 27/322 313/506 |
| 2008/0290794 | A1* | 11/2008 | Yuasa | H01L 27/3211 313/504 |
| 2009/0058283 | A1* | 3/2009 | Tanaka | H01L 51/5218 313/504 |
| 2011/0147770 | A1* | 6/2011 | Hwang | H01L 27/326 257/89 |
| 2011/0273410 | A1 | 11/2011 | Park et al. | |
| 2012/0080680 | A1* | 4/2012 | Choi | H01L 27/3218 257/59 |
| 2012/0223345 | A1* | 9/2012 | Tomoda | H01L 33/46 257/89 |
| 2012/0229014 | A1* | 9/2012 | Shiratori | H01L 51/5265 313/498 |
| 2012/0267611 | A1* | 10/2012 | Chung | H01L 27/3272 257/40 |
| 2012/0320270 | A1* | 12/2012 | Takata | G02B 6/0023 348/554 |
| 2013/0161656 | A1* | 6/2013 | Choi | H01L 51/56 257/88 |
| 2013/0194205 | A1* | 8/2013 | Park | G06F 3/047 345/173 |
| 2013/0214302 | A1 | 8/2013 | Yeh et al. | |
| 2014/0054619 | A1* | 2/2014 | Tseng | H01L 33/505 257/88 |
| 2014/0183479 | A1* | 7/2014 | Park | H01L 27/3216 257/40 |
| 2015/0009436 | A1* | 1/2015 | Kim | G02F 1/13725 349/33 |
| 2015/0054719 | A1* | 2/2015 | Lee | H01L 27/326 345/76 |
| 2015/0144910 | A1* | 5/2015 | Beak | H01L 27/1255 257/40 |
| 2015/0155435 | A1* | 6/2015 | Nei | H01L 25/0753 257/98 |
| 2015/0179895 | A1* | 6/2015 | Hemer | H01L 33/62 257/89 |
| 2015/0255505 | A1* | 9/2015 | Jeoung | H05K 1/189 257/89 |
| 2016/0056331 | A1* | 2/2016 | Kim | H01L 33/06 257/13 |
| 2016/0099383 | A1 | 4/2016 | Yuh | |
| 2016/0118451 | A1* | 4/2016 | Youn | H01L 27/3262 257/40 |
| 2016/0126295 | A1* | 5/2016 | Sato | H01L 27/3213 257/89 |
| 2016/0188061 | A1* | 6/2016 | Cho | G06F 3/0446 345/173 |
| 2016/0240518 | A1* | 8/2016 | Hayashi | H01L 25/0753 |
| 2016/0240592 | A1* | 8/2016 | Li | H01L 27/3216 |
| 2016/0321982 | A1* | 11/2016 | Lee | G09G 3/3291 |
| 2016/0380158 | A1 | 12/2016 | Sasaki et al. | |
| 2017/0053972 | A1* | 2/2017 | Kim | H01L 27/326 |
| 2017/0062492 | A1* | 3/2017 | Bae | H01L 25/50 |
| 2017/0062535 | A1* | 3/2017 | Kim | H01L 27/3246 |
| 2017/0084857 | A1* | 3/2017 | Song | H01L 27/3213 |
| 2017/0125506 | A1* | 5/2017 | Kim | H01L 27/3265 |
| 2017/0153502 | A1* | 6/2017 | Wang | G02F 1/133621 |
| 2017/0194390 | A1* | 7/2017 | Kim | H01L 27/3276 |
| 2017/0194398 | A1* | 7/2017 | Kim | H01L 27/3218 |
| 2017/0200765 | A1* | 7/2017 | Choi | H01L 33/504 |
| 2017/0236875 | A1* | 8/2017 | Kim | H01L 27/322 257/40 |
| 2017/0309859 | A1* | 10/2017 | Lee | H01L 27/3218 |
| 2017/0345802 | A1* | 11/2017 | Sung | H01L 33/38 |
| 2018/0087898 | A1* | 3/2018 | Akagi | G06T 7/521 |
| 2018/0108871 | A1* | 4/2018 | Xu | H01L 51/56 |
| 2018/0123086 | A1* | 5/2018 | Oh | H01L 27/3262 |
| 2018/0182821 | A1* | 6/2018 | Yun | H01L 27/3276 |
| 2018/0204979 | A1* | 7/2018 | Moon | H01L 33/38 |
| 2018/0226459 | A1* | 8/2018 | Bae | H01L 27/124 |
| 2018/0240937 | A1* | 8/2018 | Park | H05B 33/14 |
| 2019/0043934 | A1* | 2/2019 | Ukigaya | G09G 3/3225 |
| 2019/0081112 | A1* | 3/2019 | Tsukamoto | H01L 51/5218 |
| 2019/0173053 | A1* | 6/2019 | Choi | H01L 51/56 |
| 2019/0181205 | A1* | 6/2019 | Kim | H01L 51/5253 |
| 2019/0207156 | A1* | 7/2019 | Gil | H01L 51/5203 |
| 2019/0288163 | A1* | 9/2019 | Choi | H01L 33/36 |
| 2019/0334120 | A1* | 10/2019 | Seo | H01L 51/5246 |
| 2019/0363279 | A1* | 11/2019 | Yamaguchi | H01L 51/5253 |
| 2019/0393274 | A1* | 12/2019 | Park | H01L 27/3276 |
| 2020/0020752 | A1* | 1/2020 | Shi | H01L 51/52 |
| 2020/0073500 | A1* | 3/2020 | Jeong | H01L 51/56 |
| 2020/0075692 | A1* | 3/2020 | Park | H01L 27/3211 |
| 2020/0106046 | A1* | 4/2020 | Kim | H01L 27/326 |
| 2020/0106057 | A1* | 4/2020 | Yoo | H01L 27/3225 |
| 2020/0110525 | A1* | 4/2020 | Park | H01L 27/3223 |
| 2020/0111856 | A1* | 4/2020 | Lee | H01L 27/322 |
| 2020/0127231 | A1* | 4/2020 | Yun | H01L 51/5253 |
| 2020/0135800 | A1* | 4/2020 | Seo | H01L 27/3276 |
| 2020/0135812 | A1* | 4/2020 | Ohara | H01L 51/5256 |
| 2020/0142525 | A1* | 5/2020 | Han | G06F 1/1643 |
| 2020/0144341 | A1* | 5/2020 | Choi | H01L 51/0096 |
| 2020/0152842 | A1* | 5/2020 | Park | G06F 1/1626 |
| 2020/0159369 | A1* | 5/2020 | Seo | G06F 3/045 |
| 2020/0176531 | A1* | 6/2020 | Baek | H01L 27/3223 |
| 2020/0194510 | A1* | 6/2020 | Shin | H01L 51/5209 |
| 2020/0194532 | A1* | 6/2020 | Lee | H01L 51/0096 |
| 2020/0194714 | A1* | 6/2020 | Won | H01L 27/3225 |
| 2020/0194721 | A1* | 6/2020 | Lee | H01L 51/5246 |
| 2020/0203453 | A1* | 6/2020 | Kim | H05K 1/18 |

(56) References Cited

U.S. PATENT DOCUMENTS

| | | | | |
|---|---|---|---|---|
| 2020/0212140 A1* | 7/2020 | Huh | ................... | H01L 27/3234 |
| 2020/0213699 A1* | 7/2020 | You | ....................... | H04R 1/028 |
| 2021/0143299 A1* | 5/2021 | Cho | ................... | H01L 25/0753 |

FOREIGN PATENT DOCUMENTS

| | | |
|---|---|---|
| KR | 10-0763894 B1 | 10/2007 |
| KR | 10-1058880 B1 | 8/2011 |
| KR | 10-2017-0005643 A | 1/2017 |
| TW | 416156 B | 12/2000 |
| TW | 201336065 A1 | 9/2013 |
| WO | WO 2017/007215 A1 | 1/2017 |

* cited by examiner

DISPLAY DEVICE USING SEMICONDUCTOR LIGHT EMITTING ELEMENT, AND MANUFACTURING METHOD THEREFOR

CROSS REFERENCE TO RELATED APPLICATIONS

This application is the National Phase of PCT International Application No. PCT/KR2017/004385, filed on Apr. 25, 2017, which claims priority under 35 U.S.C. 119(a) to Patent Application No. 10-2017-0014510, filed in Republic of Korea on Feb. 1, 2017, all of which are hereby expressly incorporated by reference into the present application.

BACKGROUND OF THE INVENTION

1. Field of the Invention

The present disclosure relates to a display device and a fabrication method thereof, and more particularly, to a flexible display device using a semiconductor light emitting element.

2. Description of the Conventional Art

In recent years, display devices having excellent characteristics such as low profile, flexibility and the like have been developed in the display technical field. On the contrary, currently commercialized main displays are represented by liquid crystal displays (LCDs) and active matrix organic light emitting diodes (AMOLEDs).

However, there exist problems such as not-so-fast response time, difficult implementation of flexibility in case of LCDs, and there exist drawbacks such as short life span, not-so-good yield as well as low flexibility in case of AMOLEDs.

On the other hand, light emitting diodes (LEDs) are well known semiconductor light emitting elements for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting elements may be used to implement a flexible display, thereby presenting a scheme for solving the problems.

As described above, in case of a display using semiconductor light emitting elements, it is difficult to implement a large-sized display device. Therefore, in recent years, a manufacturing method in which semiconductor light emitting elements are coupled to a substrate in a self-assembly manner has been developed. Further, in case of a display using semiconductor light emitting elements, a method of implementing red, green and blue colors by combining a blue semiconductor light emitting element with a phosphor, a color filter and the like is widely used, but such a structure has a disadvantage of low luminous efficiency.

Accordingly, a mechanism for coupling a red semiconductor light emitting element, a green semiconductor light emitting element, and a blue semiconductor light emitting element, respectively, to the substrate through self-assembly may be taken into consideration.

SUMMARY OF THE INVENTION

An aspect of the present disclosure is to provide a structure capable of inspecting an assembled state of semiconductor light emitting elements during self-assembly in a display device.

Another aspect of the present disclosure is to provide a display device capable of sequentially self-assembling red semiconductor light emitting elements, green semiconductor light emitting elements, and blue semiconductor light emitting elements, and a manufacturing method thereof.

In a display device using semiconductor light emitting elements, red semiconductor light emitting elements, green semiconductor light emitting elements, and blue semiconductor light emitting elements may be visually distinguished from each other, and the assembled state of the semiconductor light emitting elements during self-assembly may be easily inspected.

Specifically, a display device according to the present disclosure may include a substrate having a plurality of metal pads, and green semiconductor light emitting elements and blue semiconductor light emitting elements electrically connected to the metal pads through self-assembly, wherein the green semiconductor light emitting elements and the blue semiconductor light emitting elements have identification portions having different shapes to be distinguished while being coupled to the substrate.

According to an embodiment, the green semiconductor light emitting elements and the blue semiconductor light emitting elements respectively may include a conductive semiconductor layer, a conductive electrode formed on one surface of the conductive semiconductor layer, and a passivation layer configured to surround the semiconductor light emitting element, and provided with a through hole through which the conductive electrode is exposed, wherein the identification portion is formed on any one of the conductive semiconductor layer, the conductive electrode, and the passivation layer.

According to an embodiment, the display device may further include a red semiconductor light emitting element electrically connected to the metal pads through self-assembly. Any one of a conductive semiconductor layer, a conductive electrode, and a passivation layer of the red semiconductor light emitting element may have a different shape or size from that of the green semiconductor light emitting element and the blue semiconductor light emitting element.

According to an embodiment, the metal pad may include first metal solder electrically connected to a conductive electrode of the green semiconductor light emitting element and second metal solder electrically connected to a conductive electrode of the blue semiconductor light emitting element. The first metal solder and the second metal solder may be formed of materials having different melting points.

According to an embodiment, the green semiconductor light emitting element and the blue semiconductor light emitting element may respectively include an undoped semiconductor layer, and the identification portion is formed on the undoped semiconductor layer. Grooves may be formed in the undoped semiconductor layer of the green semiconductor light emitting element and the undoped semiconductor layer of the blue semiconductor light emitting element, and patterns formed with the grooves may be configured to be different in the green semiconductor light emitting element and the blue semiconductor light emitting element.

According to an embodiment, the green semiconductor light emitting element and the blue semiconductor light emitting element may have different shapes, and the identification portions may have the different shapes.

In addition, the present disclosure discloses a method of manufacturing a display device, and the method may include growing green semiconductor light emitting elements and blue semiconductor light emitting elements separately on a growth substrate to grow light emitting structures of the green semiconductor light emitting elements and the blue semiconductor light emitting elements, separating the green semiconductor light emitting elements and the blue semiconductor light emitting elements from the growth substrate, and sequentially coupling them to a substrate through self-assembly in a chamber filled with a fluid, and inspecting whether the green semiconductor light emitting elements and the blue semiconductor light emitting elements are coupled to the preset positions of the substrate, wherein the green semiconductor light emitting elements and the blue semiconductor light emitting elements have identification portions having different shapes to be distinguished while being coupled to the substrate.

According to an embodiment, solder materials for bonding semiconductor light emitting elements and wiring electrodes may be set to have melting points from a high temperature to a low temperature in a self-assembly sequence of the semiconductor light emitting elements.

In a display device according to the present disclosure, red semiconductor light emitting elements, green semiconductor light emitting elements, and blue semiconductor light emitting elements may be sequentially self-assembled using solder materials having melting points from a high temperature to a low temperature in a self-assembly sequence. Through this, the present disclosure may realize a large-screen display with high luminous efficiency.

Furthermore, according to the present disclosure red semiconductor light emitting elements, green semiconductor light emitting elements, and blue semiconductor light emitting elements may be distinguished using an identification portion, thereby easily checking whether the assembled state is normal after each chip is selectively self-assembled. As described above, the assembled state may be visually inspected without applying power while semiconductor light emitting elements are coupled to a substrate, and thus a repair process may be carried out immediately after the semiconductor light emitting elements are coupled to the substrate. Therefore, the repair process may be more easily carried out prior to performing the post-process, thereby further facilitating repair.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENT

Figure 1:
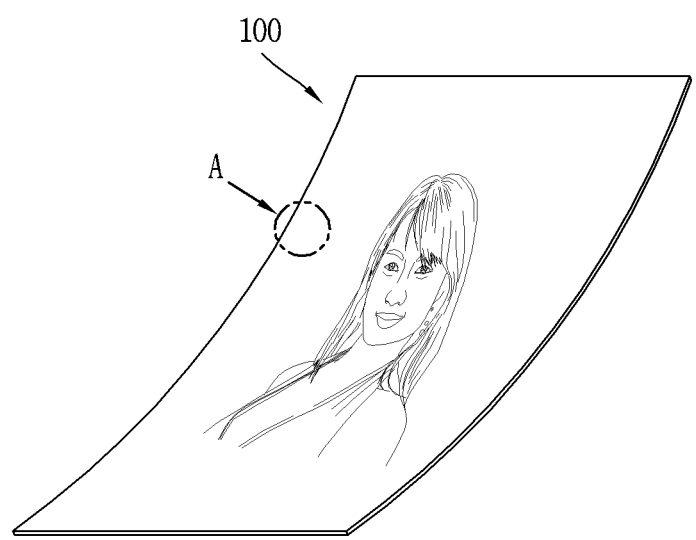
FIG. 1 is a conceptual view showing a display device using a semiconductor light emitting element according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing an embodiment disclosed herein, moreover, the detailed description will be omitted when specific description for publicly known technologies to which the invention pertains is judged to obscure the gist of the present disclosure. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display device disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view showing a display device using a semiconductor light emitting element according to an embodiment of the present disclosure.

According to the drawing, information processed in the controller of the display device 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated in the drawing, information displayed in the second configuration may be visual information displayed on a curved surface. The visual information may be realized in such a manner that a light emission of each unit pixel (sub-pixel) arranged in a matrix configuration is controlled independently. The unit pixel denotes an elementary unit for representing one color.

The sub-pixel of the flexible display may be implemented by a semiconductor light emitting element. According to the present disclosure, a light emitting diode (LED) is illustrated as a type of semiconductor light emitting element. The light emitting diode may be formed with a small size to perform the role of a sub-pixel even in the second configuration through this.

Hereinafter, a flexible display implemented using the light emitting diode will be described in more detail with reference to the accompanying drawings.

Figure 2:
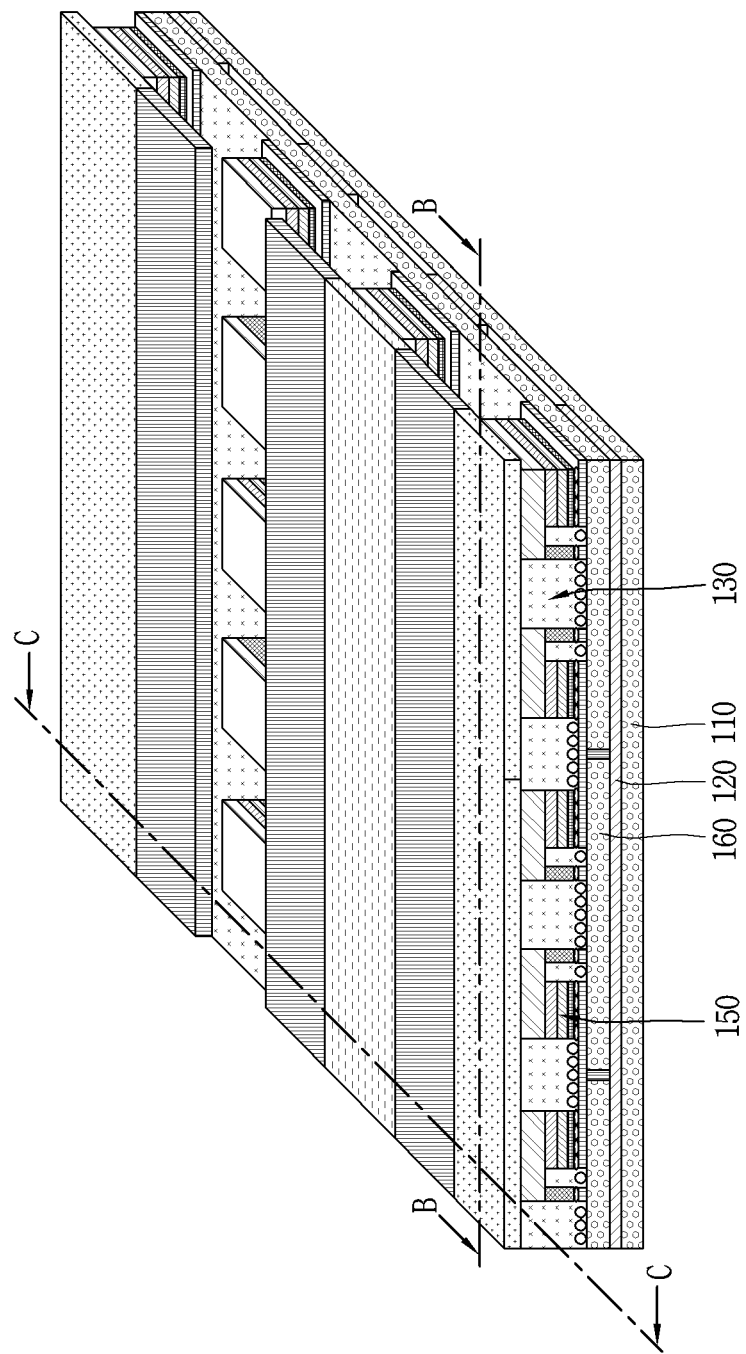
FIG. 2 is a partial enlarged view of portion "A" in FIG. 1, and FIGS. 3A and 3B are cross-sectional views taken along lines B-B and C-C in FIG. 2.
Figure 3A:
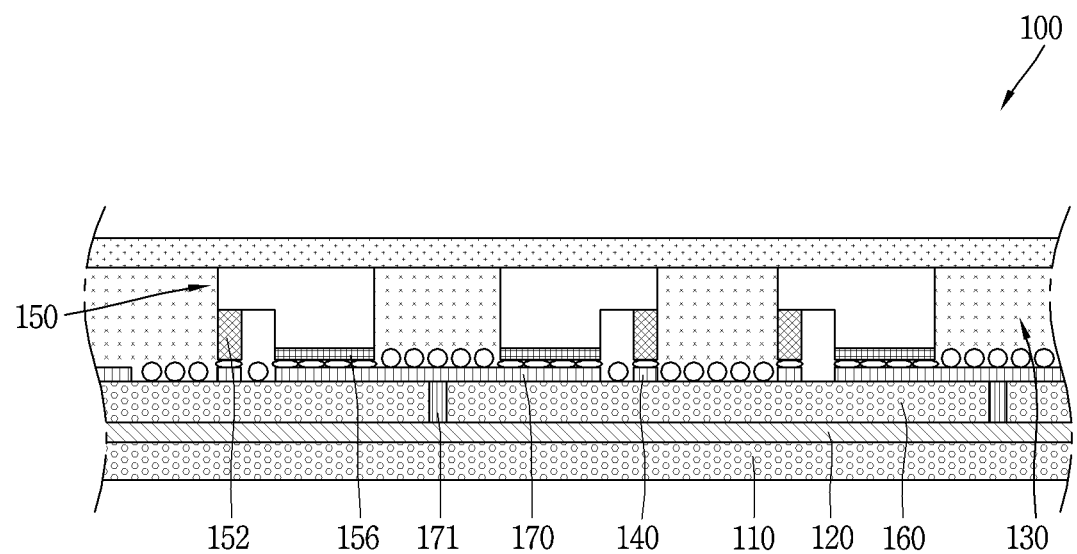
Figure 3B:
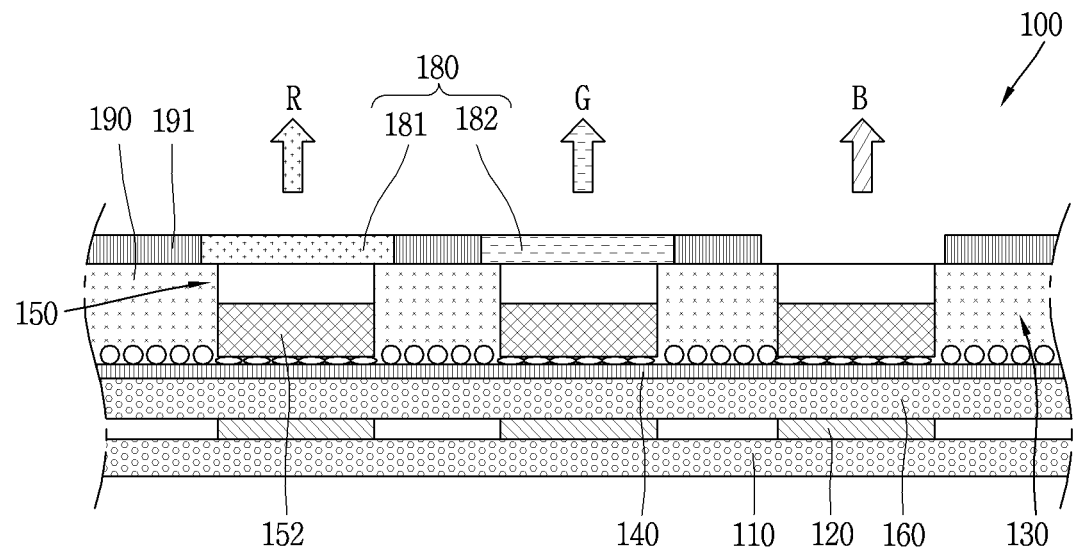
Figure 4:
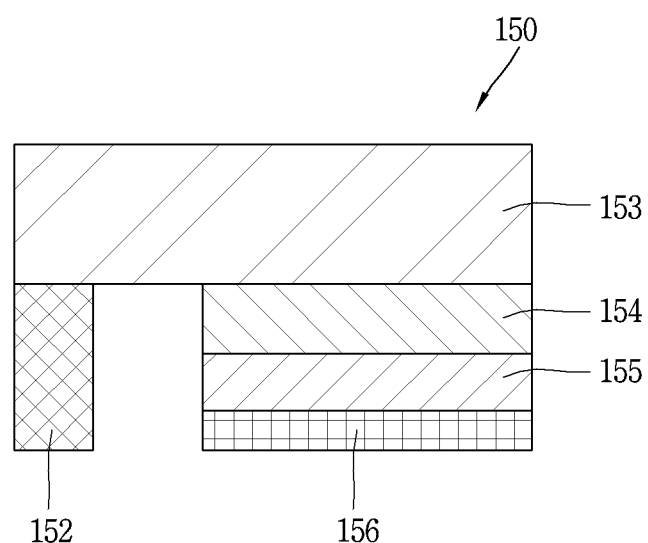
FIG. 4 is a conceptual view showing a flip chip type semiconductor light emitting element in FIG. 3.

FIG. 2 is a partial enlarged view of portion "A" in FIG. 1, and FIGS. 3A and 3B are cross-sectional views taken along lines B-B and C-C in FIG. 2, FIG. 4 is a conceptual view illustrating a flip-chip type semiconductor light emitting element in FIG. 3A, and FIGS. 5A through 5C are conceptual views illustrating various forms for implementing colors in connection with a flip-chip type semiconductor light emitting element.

According to the drawings in FIGS. 2, 3A and 3B, there is illustrated a display device 100 using a passive matrix (PM) type semiconductor light emitting element as a display device 100 using a semiconductor light emitting element. However, an example described below may also be applicable to an active matrix (AM) type semiconductor light emitting element.

The display device 100 may include a substrate 110, a first electrode 120, a conductive adhesive layer 130, a second electrode 140, and a plurality of semiconductor light emitting elements 150.

The substrate 110 may be a flexible substrate. The substrate 110 may contain glass or polyimide (PI) to implement the flexible display device. In addition, if it is a flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this case, a configuration in which the insulating layer 160 is deposited on the substrate 110 may be a single wiring substrate. More specifically, the insulating layer 160 may be incorporated into the substrate 110 with an insulating and flexible material such as polyimide (PI), PET, PEN or the like to form a single wiring substrate.

The auxiliary electrode 170 as an electrode for electrically connecting the first electrode 120 to the semiconductor light emitting element 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in the present example, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this case, it may have conductivity by means of the core while breaking an insulating layer on a portion to which heat and pressure are applied. Here, a core may be transformed to implement a layer having both surfaces to which objects contact in the thickness direction of the film. For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this case, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this case, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring again to the drawing, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light emitting element 150 is connect thereto in a flip chip form with the application of heat and pressure, the semiconductor light emitting element 150 is electrically connected to the first electrode 120 and second electrode 140.

Referring to FIG. 4, the semiconductor light emitting element may be a flip chip type semiconductor light emitting element.

For example, the semiconductor light emitting element may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this case, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light emitting elements 150. For example, the left and right p-type electrodes of the semiconductor light emitting elements around the auxiliary electrode may be electrically connected to one auxiliary electrode.

More specifically, the semiconductor light emitting element 150 is pressed into the conductive adhesive layer 130, and through this, only a portion between the p-type electrode 156 and auxiliary electrode 170 of the semiconductor light emitting element 150 and a portion between the n-type electrode 152 and second electrode 140 of the semiconductor light emitting element 150 have conductivity, and the remaining portion does not have conductivity since there is no push-down of the semiconductor light emitting element. As described above, the conductive adhesive layer 130 may form an electrical connection as well as allow a mutual coupling between the semiconductor light emitting element 150 and the auxiliary electrode 170 and between the semiconductor light emitting element 150 and the second electrode 140.

Furthermore, a plurality of semiconductor light emitting elements 150 constitute a light-emitting array, and a phosphor layer 180 is formed on the light-emitting array.

The light emitting element array may include a plurality of semiconductor light emitting elements with different self-luminance values. Each of the semiconductor light emitting elements 150 constitutes a sub-pixel, and is electrically connected to the first electrode 120. For example, there may exist a plurality of first electrodes 120, and the semiconductor light emitting elements are arranged in several rows, for instance, and each row of the semiconductor light emitting elements may be electrically connected to any one of the plurality of first electrodes.

Furthermore, the semiconductor light emitting elements may be connected in a flip chip form, and thus semiconductor light emitting elements grown on a transparent dielectric substrate. Furthermore, the semiconductor light emitting elements may be nitride semiconductor light emitting elements, for instance. The semiconductor light emitting element 150 has an excellent luminance characteristic, and thus it may be possible to configure individual sub-pixels even with a small size thereof.

According to the drawing, a partition wall 190 may be formed between the semiconductor light emitting elements 150. In this case, the partition wall 190 may perform the role of dividing individual sub-pixels from one another, and be formed as an integral body with the conductive adhesive layer 130. For example, a base member of the anisotropic conductive film may form the partition wall when the semiconductor light emitting element 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this case, the partition wall 190 may include a black or white insulator according to the purpose of the display device. It may have an effect of enhancing reflectivity when the partition wall of the while insulator is used, and increase contrast while at the same time having reflective characteristics.

The phosphor layer 180 may be located at an outer surface of the semiconductor light emitting element 150. For example, the semiconductor light emitting element 150 is a blue semiconductor light emitting element that emits blue (B) light, and the phosphor layer 180 performs the role of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light emitting element 151 at a position implementing a red sub-pixel, and a green phosphor 182 capable of converting blue light into green (G) light may be deposited on the blue semiconductor light emitting element 151 at a position implementing a green sub-pixel. Furthermore, only the blue semiconductor light emitting element 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed along the second electrode 140, thereby implementing sub-pixels.

However, the present disclosure may not be necessarily limited to this, and the semiconductor light emitting element 150 may be combined with quantum dot (QD) instead of phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the present disclosure may not be necessarily limited to this, and another structure for implementing blue, red and green may be also applicable thereto.

Figure 5A:
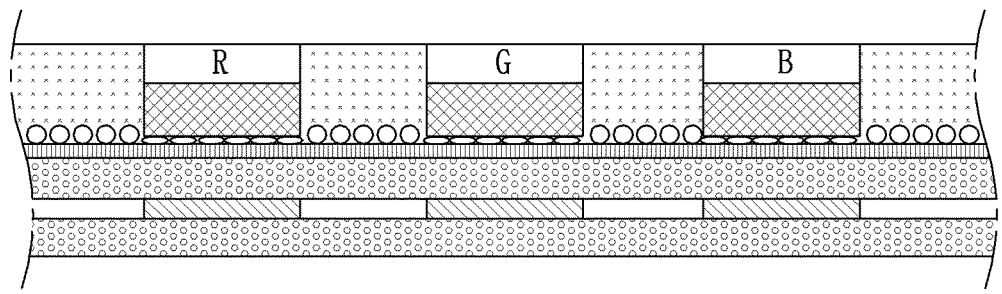
FIGS. 5A through 5C are conceptual views illustrating various forms for implementing colors in connection with a flip-chip type semiconductor light emitting element.

Referring to FIG. 5A, each of the semiconductor light emitting elements 150 may be implemented with a high-power light emitting element that emits various lights including blue in which gallium nitride (GaN) is mostly used, and indium (In) and or aluminum (Al) are added thereto.

In this case, the semiconductor light emitting element 150 may be red, green and blue semiconductor light emitting elements, respectively, to implement each sub-pixel. For instance, red, green and blue semiconductor light emitting elements (R, G, B) are alternately disposed, and red, green and blue sub-pixels implement one pixel by means of the red, green and blue semiconductor light emitting elements, thereby implementing a full color display.

Figure 5B:
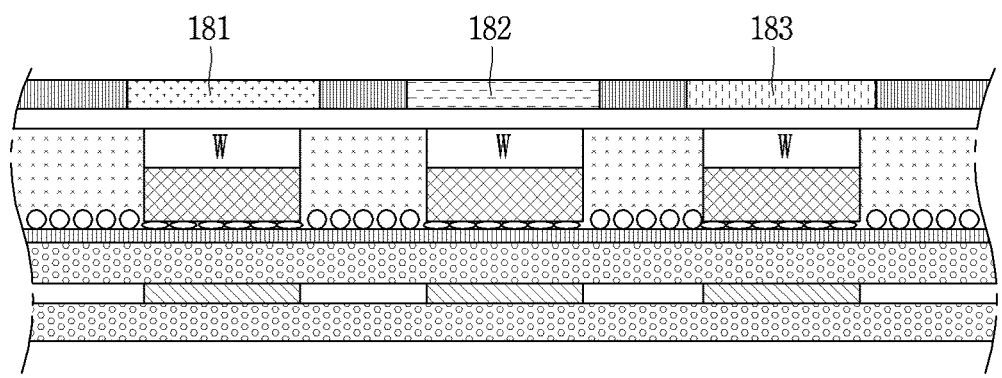

Referring to FIG. 5B, the semiconductor light emitting element may have a white light emitting element (W) provided with a yellow phosphor layer for each element. In this case, a red phosphor layer 181, a green phosphor layer 182 and blue phosphor layer 183 may be provided on the white light emitting element (W) to implement a sub-pixel. Furthermore, a color filter repeated with red, green and blue on the white light emitting element (W) may be used to implement a sub-pixel.

Figure 5C:
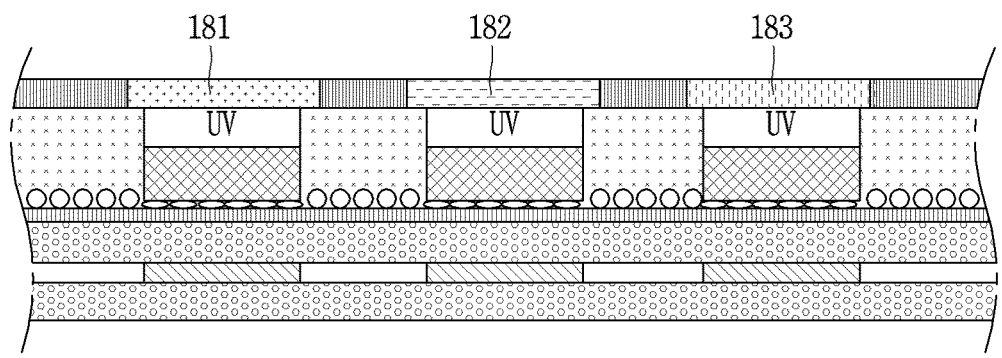

Referring to FIG. 5C, it may be possible to also have a structure in which a red phosphor layer 181, a green phosphor layer 182 and blue phosphor layer 183 may be provided on a ultra violet light emitting element (UV). In this manner, the semiconductor light emitting element can be used over the entire region up to ultra violet (UV) as well as visible light, and may be extended to a form of semiconductor light emitting element in which ultra violet (UV) can be used as an excitation source.

Taking the present example into consideration again, the semiconductor light emitting element 150 is placed on the conductive adhesive layer 130 to configure a sub-pixel in the display device. The semiconductor light emitting element 150 may have excellent luminance characteristics, and thus it may be possible to configure individual sub-pixels even with a small size thereof. The size of the individual semiconductor light emitting element 150 may be less than 80 μm in the length of one side thereof, and formed with a rectangular or square shaped element. In case of a rectangular shaped element, the size thereof may be less than 20×80 μm.

Furthermore, even when a square shaped semiconductor light emitting element 150 with a length of side of 10 μm is used for a sub-pixel, it will exhibit a sufficient brightness for implementing a display device. Accordingly, for example, in case of a rectangular pixel in which one side of a sub-pixel is 600 μm in size, and the remaining one side thereof is 300 μm, a relative distance between the semiconductor light emitting elements becomes sufficiently large. Accordingly, in this case, it may be possible to implement a flexible display device having a HD image quality.

A display device using the foregoing semiconductor light emitting element will be fabricated by a new type of fabrication method. Hereinafter, the fabrication method will be described with reference to FIG. 6.

Figure 6:
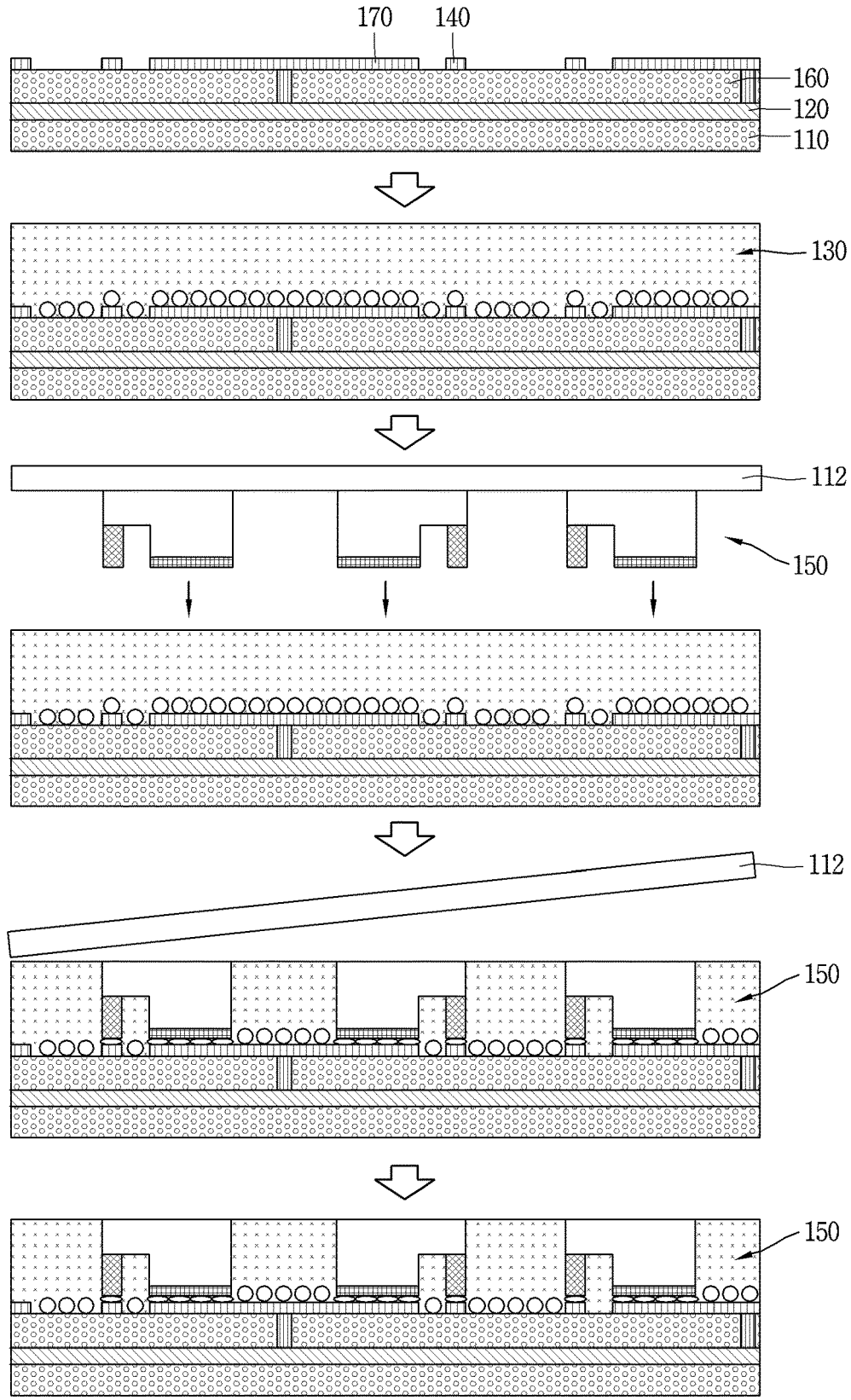
FIG. 6 is cross-sectional views showing a fabrication method of a display device using a semiconductor light emitting element according to the present disclosure.

FIG. 6 is cross-sectional views showing a fabrication method of a display device using a semiconductor light emitting element according to the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this case, the first electrode 120 and second electrode 140 may be disposed in a perpendicular direction to each other. Furthermore, the first substrate 110 and insulating layer 160 may contain glass or polyimide (PI), respectively, to implement a flexible display device.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light emitting elements 150 corresponding to the location of the auxiliary electrodes 170 and second electrodes 140 and constituting individual pixels is disposed such that the semiconductor light emitting element 150 faces the auxiliary electrode 170 and second electrode 140.

In this case, the second substrate 112 as a growth substrate for growing the semiconductor light emitting element 150 may be a sapphire substrate or silicon substrate.

The semiconductor light emitting element may have a gap and size capable of implementing a display device when formed in the unit of wafer, and thus effectively used for a display device.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light emitting element 150 and the auxiliary electrode 170 and second electrode 140 may have conductivity due to the characteristics of an anisotropic conductive film having conductivity by thermal compression, thereby allowing the electrodes and semiconductor light emitting element 150 to be electrically connected to each other. At this time, the semiconductor light emitting element 150 may be inserted into the anisotropic conductive film, thereby forming a partition wall between the semiconductor light emitting elements 150.

Next, the second substrate 112 is removed. For example, the second substrate 112 may be removed using a laser lift-off (LLO) or chemical lift-off (CLO) method.

Finally, the second substrate 112 is removed to expose the semiconductor light emitting elements 150 to the outside. Silicon oxide (SiOx) or the like may be coated on the wiring substrate coupled to the semiconductor light emitting element 150 to form a transparent insulating layer (not shown).

Furthermore, it may further include the process of forming a phosphor layer on one surface of the semiconductor light emitting element 150. For example, the semiconductor light emitting element 150 may be a blue semiconductor light emitting element for emitting blue (B) light, and red or green phosphor for converting the blue (B) light into the color of the sub-pixel may form a layer on one surface of the blue semiconductor light emitting element.

The fabrication method or structure of a display device using the foregoing semiconductor light emitting element may be modified in various forms. For such an example, the foregoing display device may be applicable to a vertical semiconductor light emitting element. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
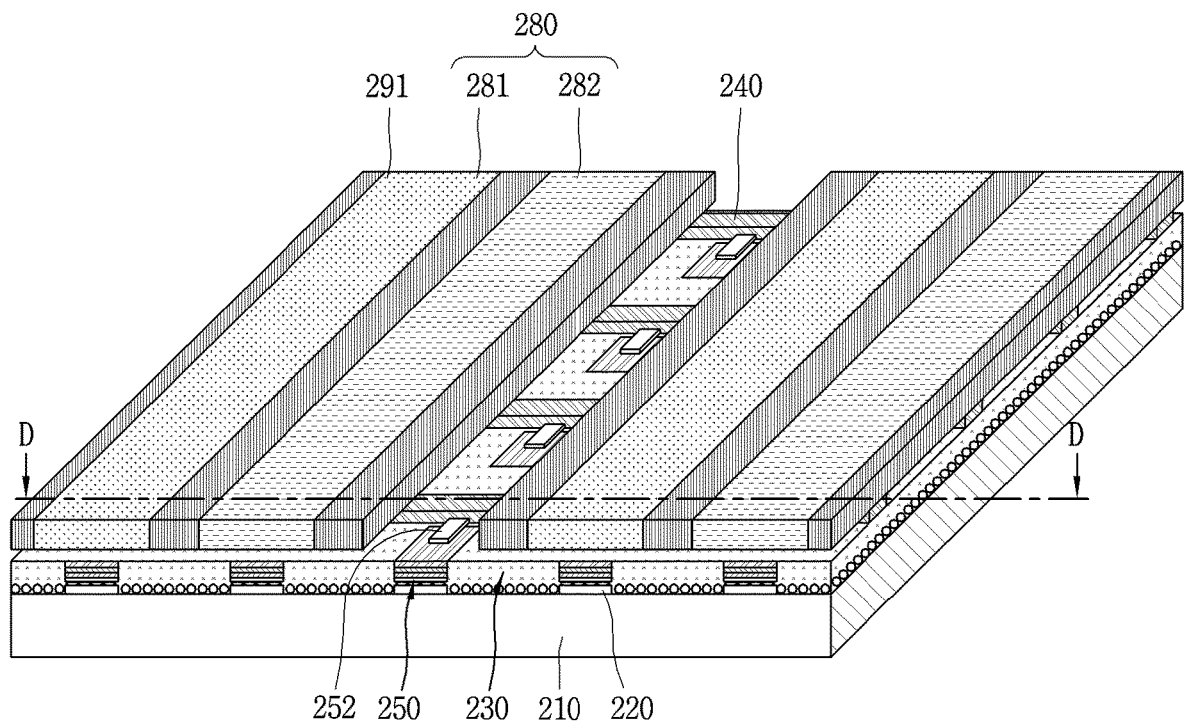
FIG. 7 is a perspective view illustrating a display device using a semiconductor light emitting element according to another embodiment of the present disclosure.
Figure 8:
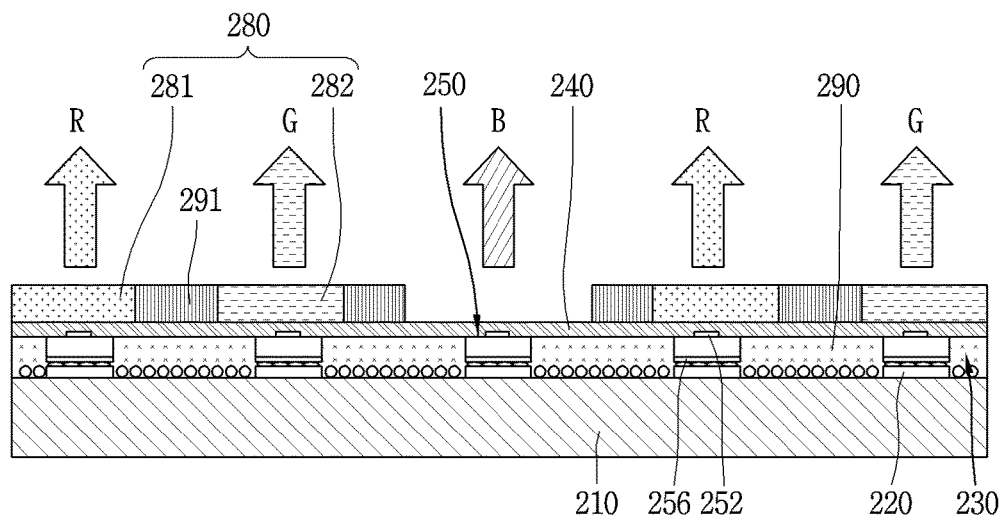
FIG. 8 is a cross-sectional view taken along line D-D in FIG. 7.
Figure 9:
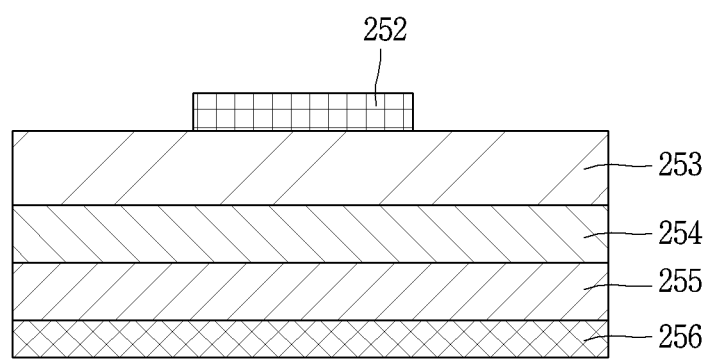
FIG. 9 is a conceptual view showing a vertical type semiconductor light emitting element in FIG. 8.

FIG. 7 is a perspective view illustrating a display device using a semiconductor light emitting element according to another embodiment of the present disclosure. FIG. 8 is a cross-sectional view taken along line C-C in FIG. 7, and FIG. 9 is a conceptual view illustrating a vertical type semiconductor light emitting element in FIG. 8.

According to the drawings, the display device may be display device using a passive matrix (PM) type of vertical semiconductor light emitting element.

The display device may include a substrate 210, a first electrode 220, a conductive adhesive layer 230, a second electrode 240 and a plurality of semiconductor light emitting elements 250.

The substrate 210 as a wiring substrate disposed with the first electrode 220 may include polyimide (PI) to implement a flexible display device. In addition, any one may be used if it is an insulating and flexible material.

The first electrode 220 may be located on the substrate 210, and formed with a bar-shaped electrode elongated in one direction. The first electrode 220 may be formed to perform the role of a data electrode.

The conductive adhesive layer 230 is formed on the substrate 210 located with the first electrode 220. Similar to a display device to which a flip chip type light emitting element is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light emitting element 250 thereto, the semiconductor light emitting element 250 is electrically connected to the first electrode 220. At this time, the semiconductor light emitting element 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion 231 having conductivity and a portion 232 having no conductivity in the thickness direction thereof.

Furthermore, the anisotropic conductive film contains an adhesive component, and thus the conductive adhesive layer 230 implements a mechanical coupling as well as an electrical coupling between the semiconductor light emitting element 250 and the first electrode 220.

In this manner, the semiconductor light emitting element 250 is placed on the conductive adhesive layer 230, thereby configuring a separate sub-pixel in the display device. The semiconductor light emitting element 250 may have excellent luminance characteristics, and thus it may be possible to configure individual sub-pixels even with a small size thereof. The size of the individual semiconductor light emitting element 250 may be less than 80 μm in the length of one side thereof, and formed with a rectangular or square shaped element. In case of a rectangular shaped element, the size thereof may be less than 20×80 μm.

The semiconductor light emitting element 250 may be a vertical structure.

A plurality of second electrodes 240 disposed in a direction of crossing the length direction of the first electrode 220, and electrically connected to the vertical semiconductor light emitting element 250 may be located between vertical semiconductor light emitting elements.

Referring to FIG. 9, the vertical semiconductor light emitting element may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light emitting element 250, thereby providing a great advantage capable of reducing the chip size.

Referring again to FIG. 8, a phosphor layer 280 may be formed on one surface of the semiconductor light emitting element 250. For example, the semiconductor light emitting element 250 is a blue semiconductor light emitting element 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light emitting element 251 at a position implementing a red sub-pixel, and a green phosphor 282 capable of converting blue light into green (G) light may be deposited on the blue semiconductor light emitting element

251 at a position implementing a green sub-pixel. Furthermore, only the blue semiconductor light emitting element 251 may be solely used at a location implementing a blue sub-pixel. In this case, the red (R), green (G) and blue (B) sub-pixels may implement one pixel.

However, the present disclosure may not be necessarily limited to this, and another structure for implementing blue, red and green may be also applicable thereto as described above in a display device to which a flip chip type light emitting element is applied.

Taking the present embodiment into consideration again, the second electrode 240 is located between the semiconductor light emitting elements 250, and electrically connected to the semiconductor light emitting elements 250. For example, the semiconductor light emitting elements 250 may be disposed in a plurality of rows, and the second electrode 240 may be located between the rows of the semiconductor light emitting elements 250.

Since a distance between the semiconductor light emitting elements 250 constituting individual pixels is sufficiently large, the second electrode 240 may be located between the semiconductor light emitting elements 250.

The second electrode 240 may be formed with a bar-shaped electrode elongated in one direction, and disposed in a perpendicular direction to the first electrode.

Furthermore, the second electrode 240 may be electrically connected to the semiconductor light emitting element 250 by a connecting electrode protruded from the second electrode 240. More specifically, the connecting electrode may be an n-type electrode of the semiconductor light emitting element 250. For example, the n-type electrode is formed with an ohmic electrode for ohmic contact, and the second electrode covers at least part of the ohmic electrode by printing or deposition. Through this, the second electrode 240 may be electrically connected to the n-type electrode of the semiconductor light emitting element 250.

According to the drawing, the second electrode 240 may be located on the conductive adhesive layer 230. According to circumstances, a transparent insulating layer (not shown) containing silicon oxide (SiOx) may be formed on the substrate 210 formed with the semiconductor light emitting element 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light emitting element 250, the ITO material has a problem of bad adhesiveness with an n-type semiconductor. Accordingly, the second electrode 240 may be placed between the semiconductor light emitting elements 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light emitting elements 250. In other words, the partition wall 290 may be disposed between the vertical semiconductor light emitting elements 250 to isolate the semiconductor light emitting element 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semiconductor light emitting element 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. In this case, the partition wall 290 may include a black or white insulator according to the purpose of the display device.

If the second electrode 240 is precisely located on the conductive adhesive layer 230 between the semiconductor light emitting elements 250, the partition wall 290 may be located between the semiconductor light emitting element 250 and second electrode 240. Accordingly, individual sub-pixels may be configured even with a small size using the semiconductor light emitting element 250, and a distance between the semiconductor light emitting elements 250 may be relatively sufficiently large to place the second electrode 240 between the semiconductor light emitting elements 250, thereby having the effect of implementing a flexible display device having a HD image quality.

Furthermore, according to the drawing, a black matrix 291 may be disposed between each phosphor layer to enhance contrast. In other words, the black matrix 291 can enhance the contrast of luminance.

As described above, the semiconductor light emitting element 250 is located on the conductive adhesive layer 230, thereby constituting individual pixels on the display device. The semiconductor light emitting element 250 may have excellent luminance characteristics, and thus it may be possible to configure individual sub-pixels even with a small size thereof. As a result, it may be possible to implement a full color display in which the sub-pixels of red (R), green (G) and blue (B) implement one pixel by means of the semiconductor light emitting element.

In a display device using the semiconductor light emitting element of the present disclosure described above, a semiconductor light emitting element grown on a wafer and formed through mesa and isolation is used as an individual pixel. Since a method of transferring a semiconductor light emitting element grown on a wafer to a wiring substrate is used, there is a problem that it is difficult to realize a large screen display due to a size limitation of the wafer. In order to solve such a problem, a method of assembling a semiconductor light emitting element into a wiring substrate in a self-assembly manner may be applied.

The self-assembly method is a method of placing semiconductor light emitting elements on a wiring substrate or an assembly substrate in a chamber filled with a fluid. For example, the semiconductor light emitting elements and the substrate are placed in a chamber filled with a fluid, and the fluid is heated in such a manner that the semiconductor light emitting elements are assembled to the substrate by themselves. For this purpose, the substrate may be provided with grooves into which the semiconductor light emitting elements are inserted. Specifically, grooves on which the semiconductor light emitting elements are placed at positions where the semiconductor light emitting elements are aligned with the wiring electrodes are formed on the substrate. The grooves are formed in a shape corresponding to a shape of the semiconductor light emitting elements, and the semiconductor light emitting elements are assembled into the grooves while randomly moving in the fluid.

Furthermore, when a large-sized screen is implemented by the self-assembly method, red semiconductor light emitting elements, green semiconductor light emitting elements, and blue semiconductor light emitting elements may be respectively self-assembled without using phosphors or color filters to enhance luminous efficiency.

In the present disclosure, a structure and method for easily checking whether the assembled state is normal after each chip is selectively self-assembled when red semiconductor light emitting elements, green semiconductor light emitting elements, and blue semiconductor light emitting elements are respectively coupled to a substrate through self-assembly will be presented. Hereinafter, it will be described in more detail with reference to the drawings.

Figure 10:
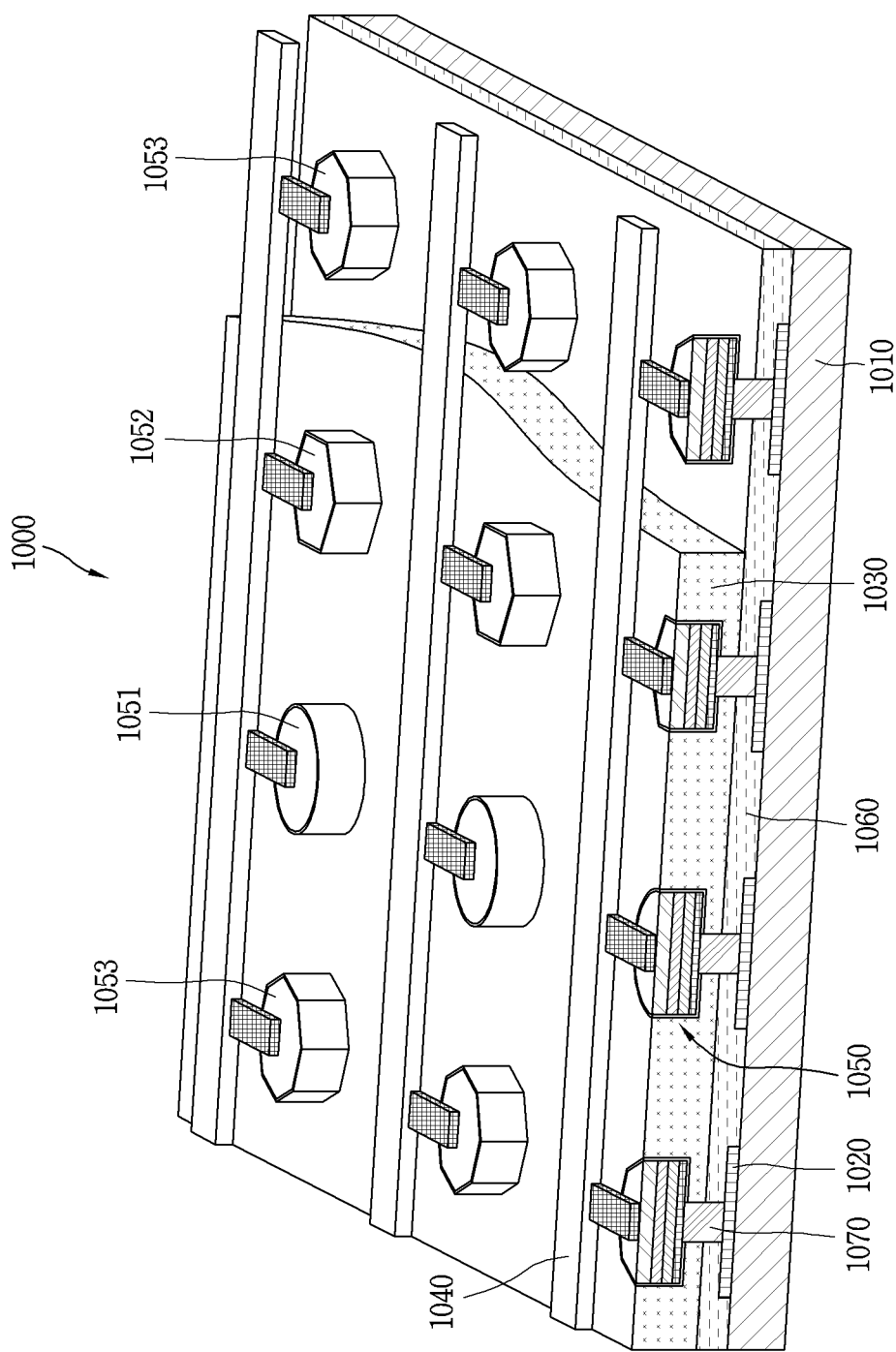
FIG. 10 is an enlarged view of portion "A" in FIG. 1 for explaining another embodiment of the present disclosure to which semiconductor light emitting elements and a wiring substrate having a new structure are applied.
Figure 11:
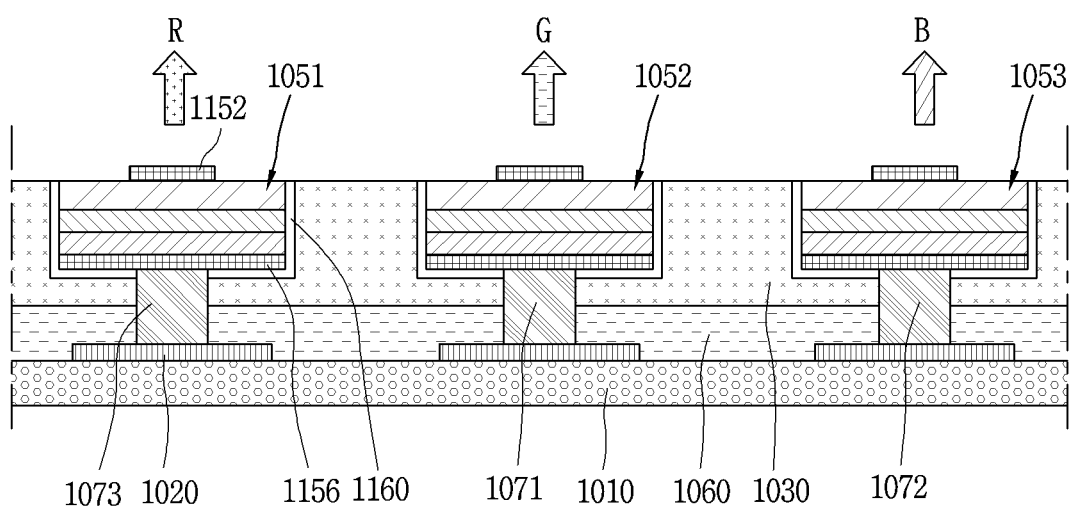
FIG. 11 is a cross-sectional view taken along line E-E in FIG. 10.
Figure 12A:
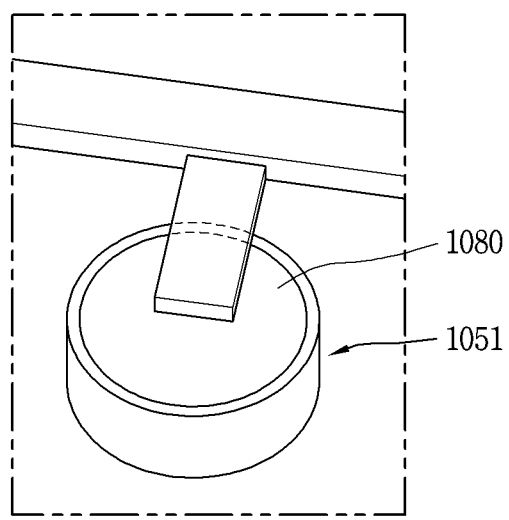
FIGS. 12A, 12B and 12C are plan views illustrating the semiconductor light emitting elements in FIG. 10.
Figure 12B:
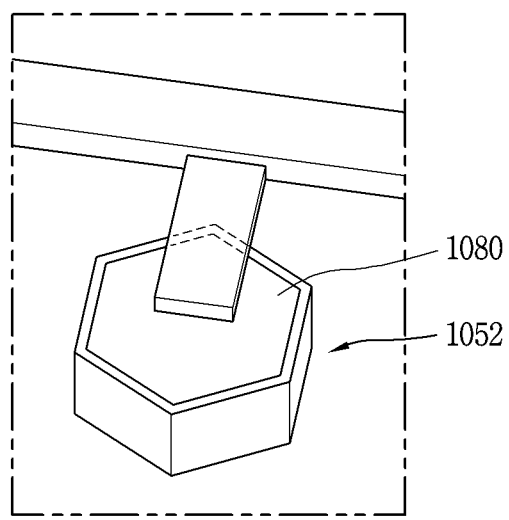
Figure 12C:
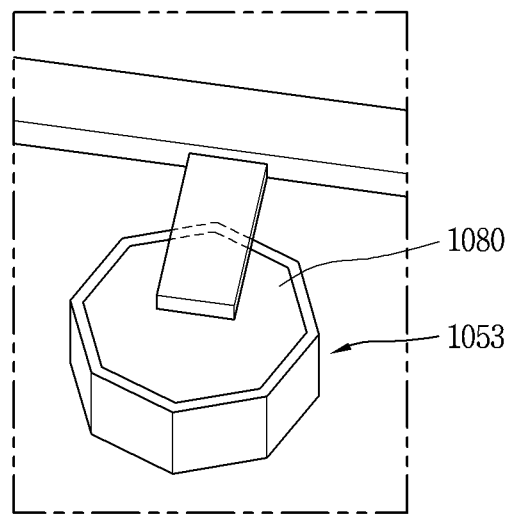
Figure 13:
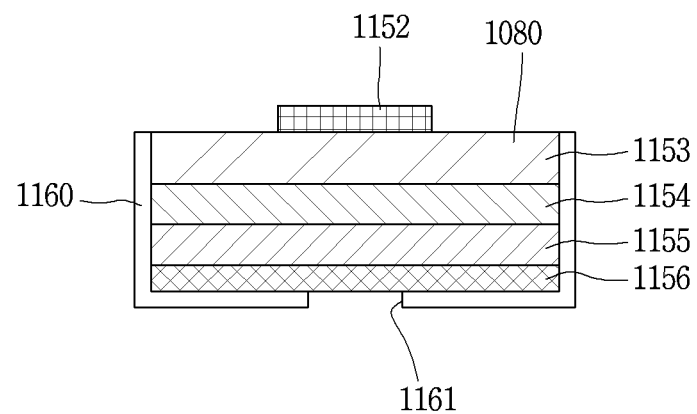
FIG. 13 is an enlarged view illustrating a semiconductor light emitting element in FIG. 10.

FIG. 10 is an enlarged view of portion "A" in FIG. 1 for explaining another embodiment of the present disclosure to which a semiconductor light emitting element and a wiring substrate having a new structure are applied, FIG. 11 is a cross-sectional view taken along line E-E in FIG. 10, FIGS. 12A, 12B and 12C are plan views illustrating the semiconductor light emitting elements in FIG. 10, and FIG. 13 is an enlarged view illustrating a semiconductor light emitting element in FIG. 10.

According to the illustrations of FIGS. 10, 11, 12A, 12B, 12C and 13, a display device 1000 using a semiconductor light emitting element is illustrated as a display device 1000 using a passive matrix (PM) type vertical semiconductor light emitting element. However, an example described below may also be applicable to an active matrix (AM) type semiconductor light emitting element.

The display device 1000 includes a substrate 1010, a first electrode 1020, a second electrode 1040, a plurality of semiconductor light emitting elements 1050, an insulating layer 1060, and metal pads 1070. Here, the first electrode 1020 and the second electrode 1040 may respectively include a plurality of electrode lines.

The substrate 1010 as a wiring substrate disposed with the first electrode 1020 may include polyimide (PI) to implement a flexible display device. In addition, any one may be used if it is an insulating and flexible material.

The first electrode 1020 may be located on the substrate 1010, and formed with a bar-shaped electrode elongated in one direction. The first electrode 1020 may be formed to perform the role of a data electrode.

According to the drawing, an insulating layer 1060 may be disposed on the substrate 1010 placed with the first electrode 1020, and the metal pads 1070 may be placed on the insulating layer 1060. More specifically, the first electrode 1020 may be disposed on one surface of the substrate 1010, and the insulating layer 1060 covering the first electrode 1020 may be formed on the first surface 1020. In this case, a configuration in which the insulating layer 1060 is deposited on the substrate 1010 may be a single wiring substrate. In addition, the first electrode 1020 may be a lower wiring made of a conductive material.

More specifically, the insulating layer 1060 may be incorporated into the substrate 1010 with an insulating and flexible material such as polyimide (PI), PET, PEN or the like while covering the lower wiring to form a single wiring substrate.

The first electrode 1020 is a lower wiring electrode, which is bonded to a p-type electrode of the semiconductor light emitting element through a metal pad, and a main element at the top of the wiring electrode may be a single component of Au, Cu, In or Sn, or a mixed component having 2, 3 or 4 elements. In this case, the wiring electrode may have a thickness of 50 nm or more to reduce the resistance.

The metal pads 1070 as an auxiliary electrode for electrically connecting the first electrode 1020 to the semiconductor light emitting element 1050 are placed on the insulating layer 1060, and disposed to correspond to the location of the first electrode 1020. For example, the metal pads 1070 have a dot shape, and may be electrically connected to the first electrode 1020 by means of an insulating through hole 1071 passing through the insulating layer 1060. In other words, the metal pads 1070 may be connected to the lower wiring, and disposed to be exposed to an outside through the insulating layer 1060.

For example, the metal pads 1070 may be formed of a material having a low melting point and applied to the first electrode 1020 in a dot shape. More specifically, the metal pads 1070 are solder materials, and the first electrode 1020 and the semiconductor light emitting element 1050 are electrically and physically connected through soldering using the solder materials. Soldering refers to bonding metals together using solder, flux and heat. The solder material may be at least one of Sn, Ag, Cu, Pb, Al, Bi, Cd, Fe, In, Ni, Sb, Zn, Co and Au.

Furthermore, the metal pad may be a metal alloy, and when the area of a GaN epi-layer is 100%, the area of the metal pad may be 25 to 100%, and an upper surface thereof may preferably have a circular shape, but may also have a polygonal shape with four or more sides. A height of the metal pad is 100 nanometers to 20 micrometers, and the height thereof may increase as the area increases. In this case, the metal pad has a convex shape protruded upward, and the component material may be a single component of In, Bi, Sn, Au, Cu or Ag, or a mixed component having 2, 3, 4, 5 or 6 elements.

According to the illustration, the semiconductor light emitting element 1050 has a shape sandwiched between the metal pads 1070 and includes a red semiconductor light emitting element 1051, a green semiconductor light emitting element 1052, and a blue semiconductor light emitting element 1053.

In this case, the structures of the red semiconductor light emitting element 1051, the green semiconductor light emitting element 1052, and the blue semiconductor light emitting element 1053 are the same, and will be described first with reference to FIG. 13. In addition, the structure of the semiconductor light emitting element described below may also be applicable to a case where a display device is formed using only one-color semiconductor light emitting elements, for example, blue semiconductor light emitting elements.

The semiconductor light emitting element may be referred to as a micro-LED, has an area range of 25 to 250000 square micrometers, and a thickness of the chip may be about 2 to 10 micrometers.

Referring to FIG. 13, the semiconductor light emitting element 1050 includes a first conductive electrode 1156, a first conductive semiconductor layer 1155 formed with the first conductive electrode 1156, an active layer 1154 formed on the first conductive semiconductor layer 1155, a second conductive semiconductor layer 1153 formed on the active layer 1154, and a second conductive electrode 1152 formed on the second conductive semiconductor layer 1153.

The first conductive semiconductor layer 1155 and the second conductive semiconductor layer 1153 overlap with each other, and the second conductive electrode 1152 is disposed on an upper surface of the second conductive semiconductor layer 1153, and the first conductive electrode 1156 is disposed on a lower surface of the first conductive semiconductor layer 1155. In this case, the upper surface of the second conductive semiconductor layer 1153 may be one surface of the second conductive semiconductor layer 1153 farthest from the first conductive semiconductor layer 1155, and the lower surface of the first conductive semiconductor layer 1155 may be one surface of the first conductive semiconductor layer 1155 farthest from the second conductive semiconductor layer 1153. In this manner, the first conductive electrode 1156 and the second conductive electrode 1152 are respective disposed on the upper and lower sides of the first conductive semiconductor layer 1155 and the second conductive semiconductor layer 1153 by interposing them therebetween.

Referring to FIG. 13 together with FIGS. 10, 11, 12A, 12B and 12C, the lower surface of the first conductive semiconductor layer 1155 may be a surface closest to the wiring substrate, and the upper surface of the second conductive semiconductor layer may be a surface farthest from the wiring substrate.

More specifically, the first conductive electrode 1156 and the first conductive semiconductor layer 1155 may be a p-type electrode and a p-type semiconductor layer, respectively, and the second conductive electrode 1152 and the second conductive semiconductor layer 1153 may be an n-type electrode and an n-type semiconductor layer, respectively. However, the present disclosure is not limited thereto, and the first conductive type may be n-type and the second conductive type may be p-type.

However, the p-type semiconductor layer may be p-type GaAs and the n-type semiconductor layer may be n-type GaAs. However, in case of the green semiconductor light emitting element and the blue semiconductor light emitting element, the p-type semiconductor layer may be p-type GaN and the n-type semiconductor layer may be n-type GaN. In addition, a p-electrode side in the p-type semiconductor layer in the present example may be p-type GaN doped with Mg, and an n-electrode side in the n-type semiconductor layer may be n-type GaN doped with Si. In this case, the above-described semiconductor light emitting elements may be semiconductor light emitting elements without an active layer. In addition, in embodiments described below, it is illustrated that the semiconductor light emitting elements include an active layer, but a structure without an active layer in which a p-electrode side of the p-type semiconductor layer is P-type GaN doped with Mg and an n-electrode side of the n-type semiconductor layer is N-type GaN doped with Si.

In this case, the conductive semiconductor layer may have an area range of 25 to 250000 square micrometers, and have a thickness of about 2 to 10 micrometers, and have a circular shape, but may also have a polygonal shape with five or more sides if necessary.

In this case, the p-type electrode located at the top thereof may be electrically connected to the first electrode 1020 by the conductive adhesive layer 1030, and the n-type electrode 252 located at the bottom thereof may be electrically connected to the second electrode 1040. Here, the p-type electrode may include a plurality of metal layers formed of different metals. For example, a plurality of metal layers made of Ti, Pt, Au, Ti, Cr or the like may be laminated to form the p-type electrode.

More specifically, the p-type electrode is bonded on Mg-doped GaN, and may be made of Au, Cu, or a mixture thereof. The area is 30 to 75% of the area of a GaN epi-layer, and the position of the electrode may be disposed at the center of the GaN epi-layer. The shape of the electrode may preferably have a circular shape, but may also have a polygonal shape with four or more sides if necessary. Here, the area and shape of the p-type electrode refers only to a portion of the p-type electrode that is open without being covered by the passivation layer. In this case, a pure area of the p-type electrode is between a partial area of the p-type electrode that is off and a total area of the GaN epi-layer. Furthermore, in order to enhance a bonding strength between GaN and Au or Cu, a Ti, Cr, or Pt layer may be added to the interface. A total thickness of the p-type electrode may be between 100 nanometers and 5 micrometers.

Here, the semiconductor light emitting element includes a passivation layer 1160 formed to surround the lateral surfaces of the first conductive semiconductor layer 1155 and the second conductive semiconductor layer 1153.

The passivation layer 1160 covers the lateral surface of the semiconductor light emitting element to stabilize the characteristics of the semiconductor light emitting element and is formed of an insulating material. As described above, the first conductive semiconductor layer 1155 and the second conductive semiconductor layer 1153 are electrically disconnected by the passivation layer 1160, and thus the p-type GaN and n-type GaN of the semiconductor light emitting element may be insulated from each other.

In this case, the passivation layer 1160 includes a through hole 1161 to expose the first conductive electrode 1156. The metal pad 1070 is inserted into the through hole 1161, so that the semiconductor light emitting element can be coupled to the wiring substrate. Here, when the semiconductor light emitting element is self-assembled, the wiring substrate is immersed in a fluid in a state where the metal pad 1070 is melted, and the metal pad 1070 and the conductive electrodes are coupled to each other while the metal pad 1070 is solidified.

A lower surface of the passivation layer 1160 may be protruded from a lower surface of the conductive electrode so as to restrict any one conductive electrode of the plurality of semiconductor light emitting elements from being in contact with another conductive electrode thereof during self-assembly. Specifically, it may have a structure in which the passivation layer 1160 covers a lower surface of the first conductive electrode 1156 (the farthest surface from the conductive semiconductor layer), and the first conductive electrode 1156 does not pass through the through hole 1161. According to such a structure, the first conductive electrode 1156 is covered in a concave shape by the passivation layer 1160, and the metal pad 1070 is coupled to the first conductive electrode 1156 through the through hole 1161.

The material of the passivation layer 1160 may be $SiO_2$ or SiNx, covering all of the sides of the GaN epi-layer and exposing the central portion of the conductive electrode. The lower surface is formed to cover all portions of the p-type electrode or the GaN epi-layer except for a portion of the p-type electrode exposed to the outside. In this case, assuming that the area of a lower surface of the GaN epi-layer is 100%, the passivation becomes 70% when an area of the p-type electrode that is open at the center occupies 30%, and the passivation becomes 25% when an area of the p-type electrode that is open at the center occupies 75%. In other words, an area of the passivation layer below the chip may be a 100-open p-type electrode area when an area of the GaN epi-layer is 100. A thickness of the passivation layer is 50 nanometers to 5 micrometers, and a thickness covering a lower surface thereof and a thickness covering a side surface thereof may be different from each other.

On the other hand, the red semiconductor light emitting element 1051, the green semiconductor light emitting element 1052, and the blue semiconductor light emitting element 1053 may be electrically connected to the metal pads through self-assembly, and referring to FIGS. 10 through 12C, each of the light emitting elements 1051, 1052, 1053 may include an identification portion 1080.

In the present disclosure, the red semiconductor light emitting element 1051, the green semiconductor light emitting element 1052, and the blue semiconductor light emitting element 1053 may be distinguished from each other using the identification portion 1080, and through this, it may be easily checked whether the assembled state is normal after each chip is selectively self-assembled. However, in this embodiment, a structure in which different colors identify semiconductor light emitting elements using identification portions, but the present disclosure is not necessarily limited thereto. For example, a concave structure of the above-described semiconductor light emitting element, a structure in which the metal pad is inserted into the through hole, and the like may be used singly regardless of the identification portion described below.

According to the illustration, the identification portion 1080 is formed to have different shapes according to the color of emitted light to distinguish the semiconductor light emitting elements in a state where the semiconductor light emitting elements are coupled to the substrate. In this case, the identification portion 1080 may be formed on any one of the conductive semiconductor layers 1153, 1155, the conductive electrode 1156, and the passivation layer 1160. In this example, the identification portion 1080 may be the conductive semiconductor layers 1153, 1155.

According to the illustration, the shapes of a conductive semiconductor layer of the red semiconductor light emitting element 1051 (hereinafter, referred to as a red conductive semiconductor layer), a conductive semiconductor layer of the green semiconductor light emitting element 1052 (hereinafter, referred to as a green conductive semiconductor layer), and a conductive semiconductor layer of the blue semiconductor light emitting element 1051 (hereinafter, referred to as a blue conductive semiconductor layer) may be different from each other. In this case, the conductive semiconductor layer forming the identification portion 1080 may be at least one of a first conductive semiconductor layer 1153 and a second conductive semiconductor layer 1155.

More specifically, any one of the red conductive semiconductor layer, the green conductive semiconductor layer, and the blue conductive semiconductor layer may have a cylindrical shape, and the remaining two may have a shape partially deformed from the cylindrical shape while having a symmetrical structure. For such an example, the red conductive semiconductor layer has a cylindrical shape according to FIG. 12A, the green conductive semiconductor layer has a hexagonal columnar shape according to FIG. 12B, and the blue conductive semiconductor layer has an octagonal columnar shape according to FIG. 12C. Therefore, the planar shape of the red conductive semiconductor layer may be circular, the planar shape of the green conductive semiconductor layer may be hexagonal, and the planar shape of the blue conductive semiconductor layer may be octagonal.

In this case, the identification portion 1080 may have different shapes of the conductive semiconductor layers 1153, 1155. In addition, in a vertical type semiconductor light emitting element as illustrated in this example, the shape of the conductive semiconductor layers 1153, 1155 may be an overall shape of the semiconductor light emitting element, and accordingly, the identification portion 1080 may have different shapes of the semiconductor light emitting elements. Here, the different shapes may include a circle, a rectangle, a pentagon, a hexagon, an octagon, and the like.

For another example of the identification portion 1080, the red conductive semiconductor layer, the green conductive semiconductor layer, and the blue conductive semiconductor layer may be formed in different sizes. Since the shape of the conductive semiconductor layers 1153, 1155 is an overall shape of the semiconductor light emitting element as described above, the identification portion 1080 may have different sizes of the red semiconductor light emitting element 1051, the green semiconductor light emitting element 1052, and the blue semiconductor light emitting element 1053.

Furthermore, the identification portion 1080 may be formed of a combination of the shapes and sizes of the red conductive semiconductor layer, the green conductive semiconductor layer, and the blue conductive semiconductor layer. For such an example, any one of the shapes of the red conductive semiconductor layer, the green conductive semiconductor layer, and the blue conductive semiconductor layer is different from another one in shape, and the size thereof may be different from the remaining one. For such an example, the red conductive semiconductor layer may have a large circular shape, the green conductive semiconductor layer may have a small circular shape, and the blue conductive semiconductor layer may have a hexagonal shape. In this case, since the shape and size of the conductive semiconductor layer are different depending on a color emitted by the semiconductor light emitting element, the red semiconductor light emitting element, the green semiconductor light emitting element, and the blue semiconductor light emitting element may be visually distinguished from each other.

However, the present disclosure is not necessarily limited to the structure described above. For example, the red semiconductor light emitting element 1051 may be replaced with the green semiconductor light emitting element 1052 or the blue semiconductor light emitting element 1053. For example, two blue semiconductor light emitting elements 1053 and one green semiconductor light emitting element 1052 may form one pixel in the semiconductor light emitting elements, an in this case, one of the blue semiconductor light emitting elements 1053 may form a blue sub-pixel, and the other one may form a red sub-pixel.

For example, a phosphor layer (not shown) may overlap with an upper surface of the blue semiconductor light emitting element 1053. The phosphor layer performs a function of converting the blue light into a color of a unit pixel. The phosphor layer includes a red phosphor and converts blue light of the blue semiconductor light emitting element into red light in a red sub-pixel. Furthermore, a red color filter (not shown) for filtering a wavelength range other than light corresponding to red light overlaps with an upper surface of the phosphor layer to improve color purity.

When the blue semiconductor light emitting element 1053 is disposed on the red sub-pixel and the blue sub-pixel, respectively, as described above, the identification portion 1080 is provided only for the green semiconductor light emitting element 1052 and the blue semiconductor light emitting element 1053. Moreover, even in another embodiment of the present disclosure described later with reference to FIGS. 14 through 16, the blue semiconductor light emitting element 1053 may be provided for a red sub-pixel, and in this case, the identification portion 1080 may be formed only for the green semiconductor light emitting element 1052 and the blue semiconductor light-emitting element 1053.

On the other hand, referring to FIGS. 10 through 12C, a plurality of second electrodes 1040 disposed in a direction of crossing the length direction of the first electrode 1020, and electrically connected to the semiconductor light emitting element 1050 may be located between the semiconductor light emitting elements.

According to the drawings, the second electrode 1040 may be located on a planarizing layer 1030. The planarizing layer 1030 is disposed between the insulating layer 1060 and the second electrode 1040 of the wiring substrate. More specifically, an insulating material is filled between the semiconductor light emitting elements to form a planarizing layer, and the second electrode 1040, which is an upper wiring, is disposed on one surface of a planarizing layer 1030. In this case, the second electrode 1040 may be electrically connected by contact with the second conductive electrode 1040 of the semiconductor light emitting element 1050.

A plurality of semiconductor light emitting elements 1050 are coupled to the wiring substrate 1010, and electrically connected to the first electrode 1020 and the second electrode 1040 by the foregoing structure.

As shown in the drawing, the plurality of semiconductor light emitting elements 1050 may form a plurality of rows in a direction parallel to a plurality of electrode lines provided in the first electrode 1020. However, the present disclosure is not necessarily limited thereto. For example, the plurality of semiconductor light emitting elements 1050 may form a plurality of rows along the second electrode 1040.

On the other hand, the semiconductor light emitting element and the metal pad of the present example are provided with a mechanism capable of ensuring assembly reliability during self-assembly.

For example, the metal pads 1070 may include a first metal solder 1071 electrically connected to the conductive electrode 1156 of the green semiconductor light emitting element and a second metal solder 1072 electrically connected to the conductive electrode 1156 of the blue semiconductor light emitting element. The first metal solder 1071 and the second metal solder 1072 may be formed of materials having different melting points.

Furthermore, the metal pad may include a third metal solder 1073 electrically connected to the conductive electrode 1156 of the red semiconductor light emitting element 1051, and the third metal solder 1073 may be formed of a material having a melting point different from that of at least one of the first metal solder 1071 and the second metal solder 1072.

Here, the first metal solder 1071, the second metal solder 1072, and the third metal solder 1073 may be solder materials having melting points from a high temperature to a low temperature in a self-assembly sequence. If the order of self-assembly is in the sequence of the red semiconductor light emitting element 1051, the green semiconductor light emitting element 1052, and the blue semiconductor light emitting element 1053, then the metal solders thereof may be formed of materials having high melting points in the sequence of the corresponding metal solders. In other words, if the semiconductor light emitting element that is self-assembled first is the green semiconductor light emitting element 1052, the second metal solder 1072 is formed of a material having the highest melting point.

The melting point (fusing point) is controlled by adjusting one or more elements among the metals of Sn, Ag, Cu, Pb, Al, Bi, Cd, Fe, In, Ni, Sb, Zn, Co and Au or an 8-component composition. In this example, the components of the metals may be suitably adjusted to have a melting point temperature between 45 and 300° C., and for a more specific example, a metal solder between 150 and 300° C. capable of withstanding the driving conditions of a display and the post-process temperature thereof may be used.

Meanwhile, the identification portion described above may be modified into various forms. Hereinafter, these modified examples will be described.

Figure 14:
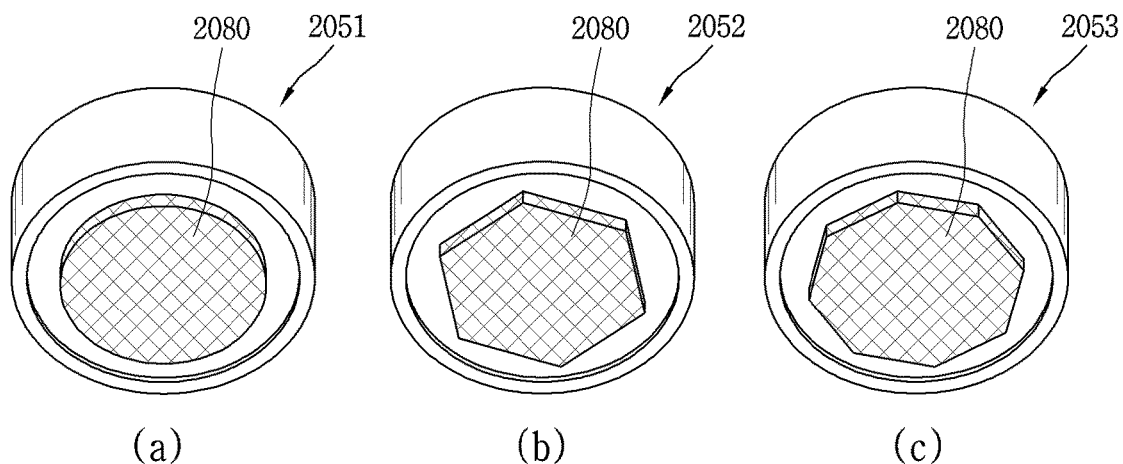
FIGS. 14 through 16 are conceptual views showing various forms of implementing an identification portion with respect to the semiconductor light emitting element.
Figure 15:
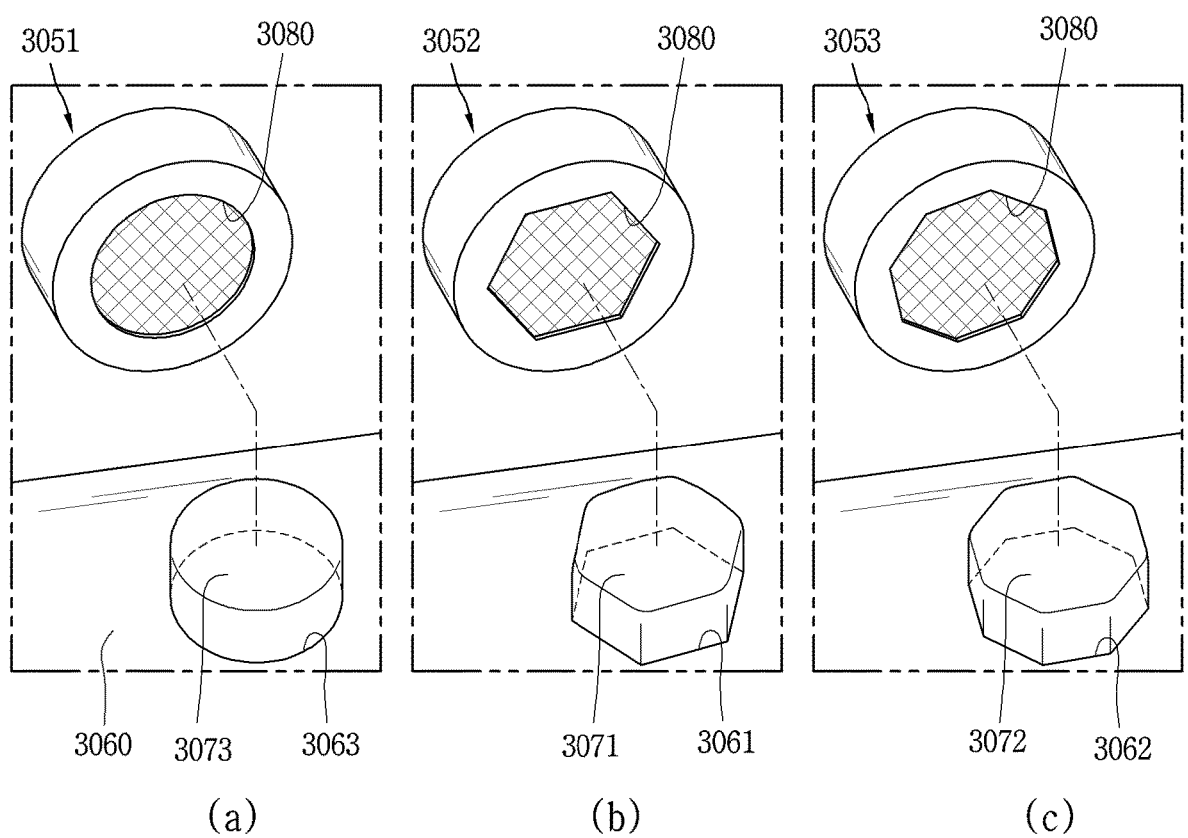
Figure 16:
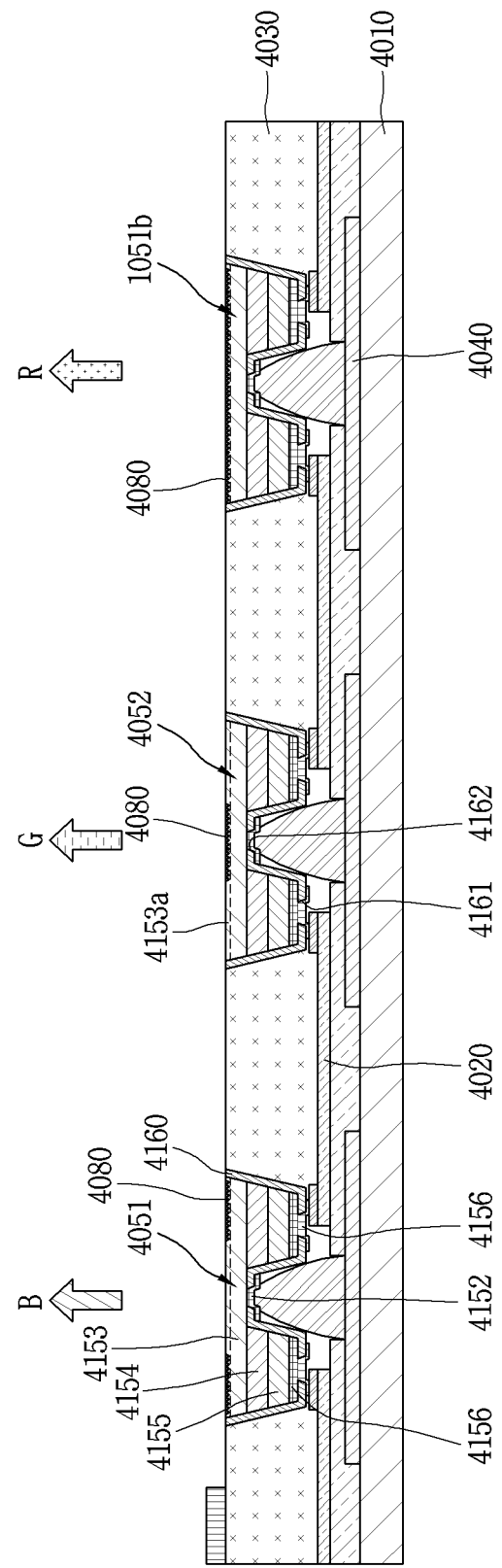

Furthermore, FIGS. 14 through 16 are conceptual views showing various forms of implementing an identification portion with respect to the semiconductor light emitting element.

In an example of FIG. 14, the same reference numerals are designated to the same components as those of the example described above with reference to FIGS. 10 through 13, and the description thereof will be substituted by the earlier description. Specifically, the remaining configurations except for the identification portion are the same as those of the example described in FIGS. 10 through 13.

Referring to the present drawings, the identification portion 2080 is a conductive electrode of the green semiconductor light emitting element 2052 and a conductive electrode of the blue semiconductor light emitting element 2053, and the conductive electrode of the green semiconductor light emitting element 2052 and the conductive electrode of the blue semiconductor light emitting element 2053 may have different shapes and sizes. For example, the identification portions 2080, which are a first conductive electrode (hereinafter, referred to as a green conductive electrode) of the green semiconductor light emitting element 2052 shown in (b) of FIG. 14 and a second conductive electrode (hereinafter, referred to as a blue conductive electrode) of the blue semiconductor light emitting element 2053 shown in (c) of FIG. 14, may have different shapes and sizes.

In this case, the first conductive electrode (hereinafter, referred to as a red conductive electrode) of the red semiconductor light emitting element 2051 shown in (a) of FIG. 14 may have a different shape or size from the green conductive electrode and the blue conductive electrode. For example, the red conductive electrode may be circular, the green conductive electrode may be hexagonal, and the blue conductive electrode may be octagonal. For another example, the sizes of the electrodes may increase in the order of the red conductive electrode, the green conductive electrode, and the blue conductive electrode.

In this case, since a conductive semiconductor layer of the semiconductor light emitting element is transparent, the shapes of the red conductive electrode, the green conductive electrode, and the blue conductive electrode may be visually distinguished from each other. Therefore, according to the structure of this example, it may be determined by visual inspection whether the red semiconductor light emitting element, the green semiconductor light emitting element, and the blue semiconductor light emitting element are self-assembled at preset positions.

In an example of FIG. 15, the same reference numerals are designated to the same components as those of the example described above with reference to FIGS. 10 through 13, and the description thereof will be substituted by the earlier description. Specifically, the remaining configurations except for the identification portion 3080 and the metal pad are the same as those of the example described in FIGS. 10 through 13.

Referring to the present drawing, 15B, the identification part 3080 is a passivation layer of the green semiconductor light emitting element 3052 shown in (b) of FIG. 15 and a passivation layer of the blue semiconductor light emitting element 3053 shown in (c) of FIG. 15, and a through hole (hereinafter, referred to as a green through hole) formed in the passivation layer of the green semiconductor light emitting element 3052 and a through hole (hereinafter, referred to as a green through hole) formed in the passivation layer of the blue semiconductor light emitting element 3053 may have different shapes and sizes. Furthermore, as illustrated in FIG. 15A, a through hole (hereinafter, referred to as a red through hole) formed in the passivation layer of the red semiconductor light emitting element 3051 may have a different shape or size from that of the green through hole and the blue through hole.

For example, the red through hole may be circular, the green through hole may be hexagonal, and the blue through hole may be octagonal. For another example, the sizes of the through holes may increase in the order of the red through hole, the green through hole, and the blue through hole. Meanwhile, since the shapes of the through holes are formed to be different from each other, it may be defined that the shapes of the passivation layers are formed to be different from each other in this example.

Furthermore, according to the illustration, in a portion where the metal pad is exposed to the outside, a first portion 3072 to which a conductive electrode of the green semiconductor light emitting element is coupled, and a second portion 3073 to which a conductive electrode of the blue semiconductor light emitting element may have different shapes or sizes. In addition, a third portion 3071 to which a conductive electrode of the red semiconductor light emitting element is coupled may have a different shape or size from that of the first portion 3072 and the second portion 3073.

More specifically, for insulating through holes passing through the insulating layer 3060, the through holes corresponding to the red semiconductor light emitting element 3051, the green semiconductor light emitting element 3052, and the blue semiconductor light emitting element 3053 may be formed to have different shapes or sizes. For example, the insulating through holes may be formed to have the same shape as the through holes of the corresponding semiconductor light emitting elements, respectively. For example, the first insulating through hole 3062 corresponding to the green through hole may be hexagonal, the second insulating through hole 3063 corresponding to the blue through hole may be octagonal, and the third insulating through hole 3061 corresponding to the red through hole may be circular. Accordingly, the first portion 3072, the second portion 3073 and the third portion 3071 may be solder coated through hexagonal, octagonal and circular through holes, respectively, and thus the first portion 3072, the second portion 3073 and the third portion 3071 may be more easily inserted into the corresponding passivation.

Figure 18:
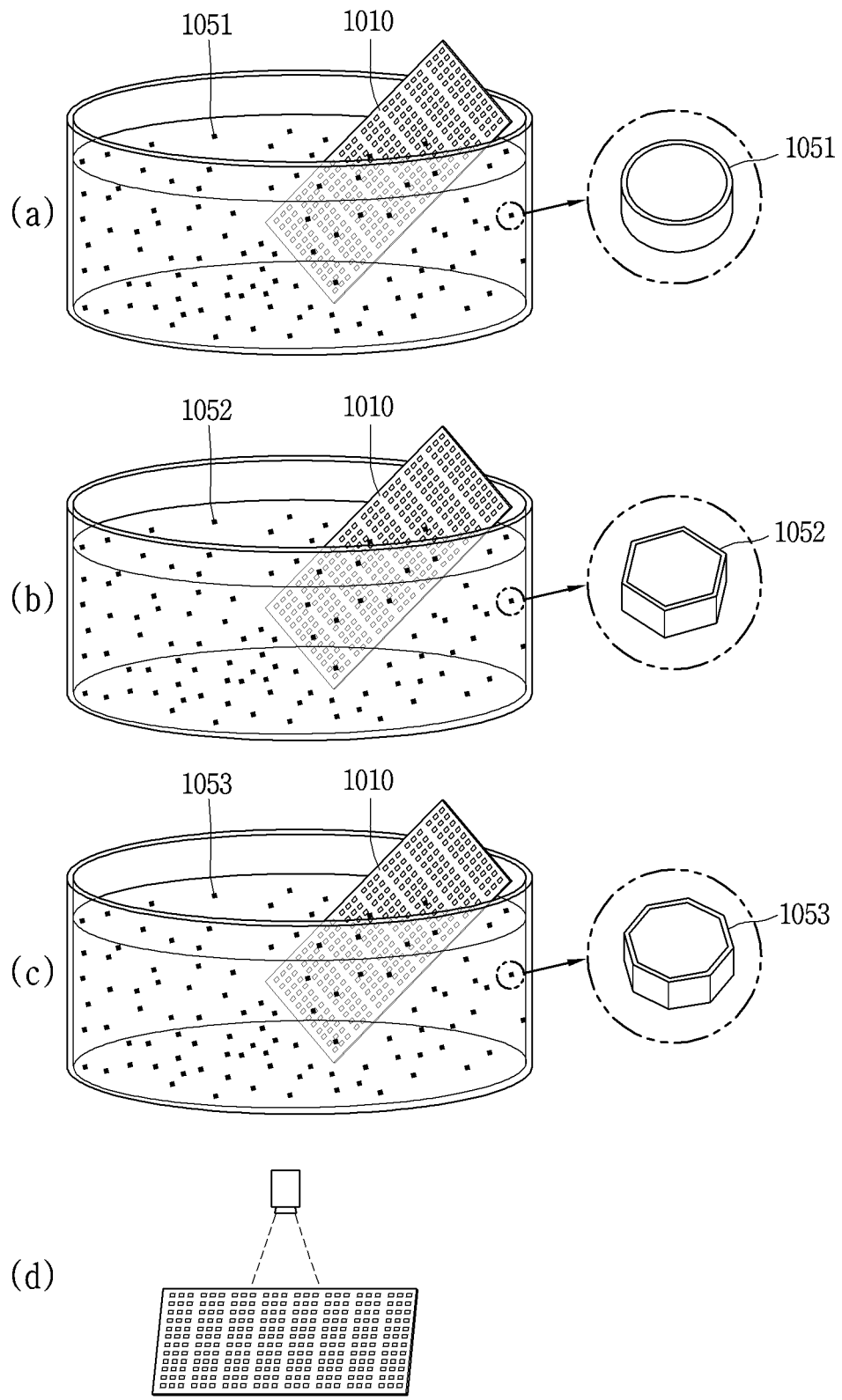

On the other hand, according to an example in FIG. 18, it is illustrated a display device using passive matrix (PM) flip-chip type semiconductor light emitting elements as a display device 1000 using semiconductor light emitting elements. However, an example described below may also be applicable to an active matrix (AM) type semiconductor light emitting element.

In the present example to be described below, the same or similar reference numerals are designated to the same or similar components as those of the example described above with reference to FIGS. 10 through 12, and the description thereof will be substituted by the earlier description.

Referring to the present drawing, the semiconductor light emitting element 4050 may be a circular, triangular, square and polygonal shape having symmetry. Hereinafter, a circular semiconductor light emitting element 4050 will be described as an example.

The semiconductor light emitting element according to the present disclosure includes a first conductive electrode 4156, a first conductive semiconductor layer 4155 formed with the first conductive electrode 4156, an active layer 4154 formed on the first conductive semiconductor layer 4155, a second conductive semiconductor layer 4153 formed on the active layer 4154, and a second conductive electrode 4152 formed on the second conductive semiconductor layer 4153.

The first conductive semiconductor layer 4155 and the second conductive semiconductor layer 4153 overlap with each other, and the second conductive electrode 4152 is disposed on a lower surface of the second conductive semiconductor layer 4153, and the first conductive electrode 4156 is disposed on a lower surface of the first conductive semiconductor layer 4155.

In this case, a lower surface of the first conductive semiconductor layer 4155 may be a surface closest to the substrate 4010, and an upper surface of the second conductive semiconductor layer 4153 may be a surface the farthest from the substrate 4010.

As described above, the first and second conductive electrodes 4156, 4152 are disposed on the lower surfaces of the first conductive semiconductor layer 4155 and the second conductive semiconductor layer 4153, respectively, and the first conductive electrode 4156 and the second conductive electrode 4152 may be arranged to be spaced apart from each other in a horizontal direction.

Moreover, the semiconductor light emitting element according to the present disclosure further includes a passivation layer 4160 formed to surround the semiconductor light emitting element. The passivation layer 4160 may be disposed between the first conductive electrode 4156 and the second conductive electrode 4152, and the first conductive electrode 4156 and the second conductive electrode 4152 may be insulated from each other through the passivation layer 4160.

The passivation layer 4160 is formed to surround at least part of the side surfaces of the first conductive semiconductor layer 4155, the active layer 4154 and the second conductive semiconductor layer 4153.

As shown in the illustration, the passivation layer 4160 may have an annular first through hole 4161 and a circular second through hole 4162. The to first through hole 4161 may be formed to surround the second through hole 4162.

The first conductive semiconductor layer 4155 is exposed to the outside through the first through hole 4161, and the second conductive semiconductor layer 4156 is formed on the first conductive semiconductor layer 4155 exposed through the first through hole 4161. Similarly, the second conductive is semiconductor layer 4153 is exposed to the outside through the second through hole 4162, and the second conductive electrode 4152 is formed on one surface of the second conductive semiconductor layer 4153 exposed through the second through hole 4162.

On the other hand, the first conductive electrode 4156 is extended along an outer circumference of the second through hole 4162 to surround the second conductive electrode 4152 as shown in the illustration. In this case, the first conductive electrode 4156 may have an annular shape.

The first electrode 4020 and the second electrode 4040 may be formed on different layers of the substrate, and may have a structure in which part of the substrate is exposed to the outside. A solder material may be applied to each of the first electrode 4020 and the second electrode 4040, and coupled to the first conductive electrode 4156 and the second conductive electrode 4152.

On the other hand, the first conductive electrode 4156 and the first conductive semiconductor layer 4155 may be a p-type electrode and a p-type semiconductor layer, respectively, and the second conductive electrode 4152 and the second conductive semiconductor layer 4153 may be an n-type electrode and an n-type semiconductor layer, respectively.

In this case, an undoped semiconductor layer 4153*a* may be formed on the other surface of the second conductive semiconductor layer 4153. In this example, the identification portion 4080 may be grooves formed in the undoped semiconductor layer.

More specifically, grooves are formed in the undoped semiconductor layer of the green semiconductor light emitting element 4052 and the undoped semiconductor layer of the blue semiconductor light emitting element 4053, and patterns formed by the grooves may be different from each other on the green semiconductor light emitting element 4052 and the blue semiconductor light emitting element 4053. Moreover, grooves having a different pattern from those of the undoped semiconductor layers of the green semiconductor light emitting element 4052 and the blue semiconductor light emitting element 4053 may be formed on the undoped semiconductor layer of the red semiconductor light emitting element 4051. The grooves may be a pattern implemented by texturing, and the pattern may vary depending on the color of light emitted from the semiconductor light emitting element, thereby allowing visual inspection.

According to the structure described above, a display device in which the semiconductor light emitting elements are sequentially self-assembled according to their colors may be implemented, and a structure capable of inspecting the assembled state during self-assembly may be implemented.

Figure 17:
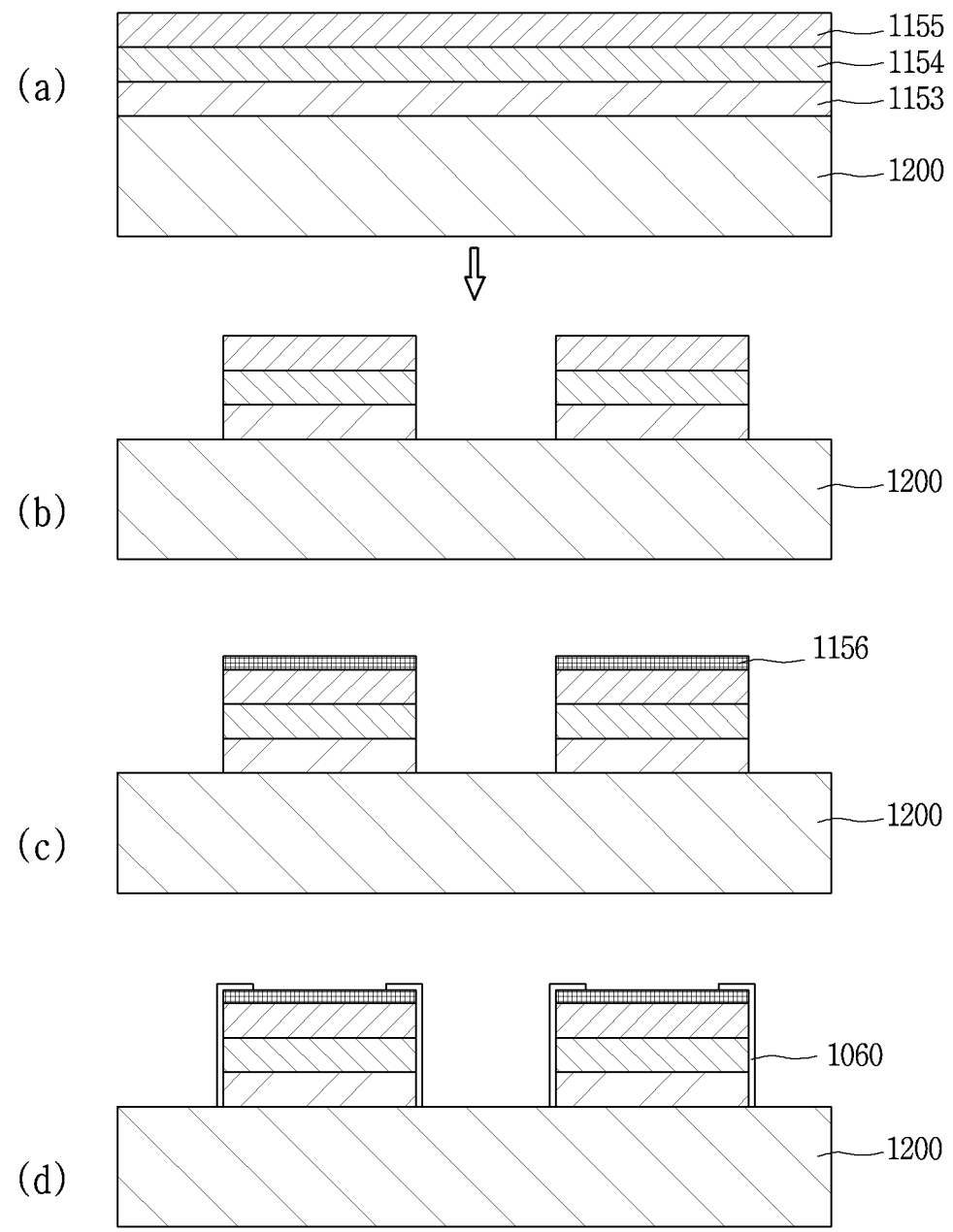
FIGS. 17 and 18 are conceptual views showing a method of manufacturing a display device according to the present disclosure.

Hereinafter, a method of manufacturing a display device using semiconductor light emitting elements having the foregoing structure will be described in detail with reference to the accompanying drawings. FIGS. 17 and 18 are conceptual views showing a method of manufacturing a display device according to the present disclosure.

First, according to a manufacturing method, a second conductive semiconductor layer 1153, an active layer 1154, and a first conductive semiconductor layer 1155 are respectively grown on a growth substrate 1200 (wafer) ((a) of FIG. 17).

When the second conductive semiconductor layer 1153 is grown, next, the active layer 1154 is grown on the second conductive semiconductor layer 1153, and then the first conductive semiconductor layer 1155 is grown on the active layer 1154.

When the second conductive semiconductor layer 1153, the active layer 1154 and the first conductive semiconductor layer 1155 are sequentially grown as described above, a layered structure of micro semiconductor light emitting elements is formed as illustrated in (a) of FIG. 17.

The growth substrate 1200 may be formed of any one of materials having light transmission properties, for example, sapphire (Al$_2$O$_3$), GaN, ZnO, and AlO, but is not limited thereto. Furthermore, the growth substrate 1200 may be formed of a carrier wafer, which is a material suitable for semiconductor material growth. The growth substrate 1200 may be formed of a material having an excellent thermal conductivity, and for example, a SiC substrate having a higher thermal conductivity than a sapphire (Al$_2$O$_3$) substrate or a SiC substrate including at least one of Si, GaAs, GaP, InP and Ga$_2$O$_3$ may be used.

Next, isolation is carried out such that a plurality of light emitting elements form a light emitting element array on the growth substrate 1200. In other words, the first conductive semiconductor layer 1155, the active layer 1154, and the second conductive semiconductor layer 1153 are etched to form a plurality of semiconductor light emitting elements ((b) of FIG. 17).

Next, the first conductive electrode 1156 is formed on the first conductive semiconductor layer 1155 exposed to the outside as illustrated in (c) of FIG. 17, and the passivation layer 1160 formed to surround the semiconductor light emitting element is formed as illustrated in (d) of FIG. 17.

In this case, the green semiconductor light emitting element and the blue semiconductor light emitting element may be separately grown on the growth substrate so that the light emitting structure of the green semiconductor light emitting element and the blue semiconductor light emitting element is grown. Furthermore, the red semiconductor light emitting element may be grown on a separate growth substrate so that the light emitting structure of the red semiconductor light emitting element is grown. Here, as an example described with reference to FIGS. 10 through 16, the semiconductor light emitting elements may include identification portions, and the identification portions are configured to have different shapes according to the color of emitted light to be distinguished in a state where the semiconductor light emitting elements are coupled to the substrate. In this case, the identification portion may be formed in any one of the conductive semiconductor layer, the conductive electrode, and the passivation layer.

In this embodiment, it is illustrated that the above-described identification portion is provided in the conductive semiconductor layer with reference to FIGS. 10 to 13. FIG. Accordingly, the plane shape of a red conductive semiconductor layer is circular, the plane shape of a green conductive semiconductor layer is hexagonal, and the plane shape of a blue conductive semiconductor layer may be octagonal. However, this embodiment is not limited thereto, and it is also possible to provide the identification portion in another embodiment described above with reference to FIGS. 14 through 16.

Next, as illustrated in FIG. 18, the green semiconductor light emitting elements 1052 and the blue semiconductor light emitting elements 1053 are separated from the growth substrate, and sequentially coupled to the substrate 1010 through self-assembly in a chamber filled with a fluid. In this case, the red semiconductor light emitting elements 1051 may also be separated from the growth substrate and coupled to the substrate 1010 through self-assembly.

Referring to (a) of FIG. 18, the red semiconductor light emitting elements 1051 and the substrate 1010 are first placed in a chamber filled with a fluid, and the red semiconductor light emitting elements 1051 are self-assembled to the substrate 1010 by heating the fluid. In this case, metal solder may be applied to the substrate 1010 only at positions where the red semiconductor light emitting elements 1051 are to be assembled.

In this case, a lower surface of the passivation layer 1160 of the semiconductor light emitting element may be protruded from a lower surface of the conductive electrode. Specifically, it may have a structure in which the passivation layer 1160 covers a lower surface of the first conductive electrode 1156 (the farthest surface from the conductive semiconductor layer), and the first conductive electrode 1156 does not pass through the through hole 1161. According to such a structure, the first conductive electrode 1156 may be covered in a concave shape by the passivation layer 1160, and therefore, the conductive electrodes of adjacent semiconductor light emitting elements may be alleviated and prevented from being in contact with each other. In addition, such a concave structure is not limited to this example, and may also be applicable to, for example, a case where one-color semiconductor light emitting elements are self-assembled.

Referring to (b) of FIG. 18, then, the green semiconductor light emitting elements 1052 and the substrate 1010 are placed in the chamber to induce the self-assembly of the green semiconductor light emitting elements 1052 by heating the fluid. In this case, metal solder may be applied to the first electrode on the substrate 1010 at positions where the green semiconductor light emitting elements 1052 are to be assembled. In addition, the metal solder at this time may be formed of a material having a melting point lower than that of the metal solder at positions where the red semiconductor light emitting elements 1051 are assembled.

Finally, referring to (c) of FIG. 18, the blue semiconductor light emitting elements 1053 and the substrate 1010 are placed in the chamber to induce the self-assembly of the blue semiconductor light emitting elements 1053 by heating the fluid. In this case, metal solder having a melting point lower than that of red and green may be applied to the substrate 1010 at positions where the blue semiconductor light emitting elements 1053 are to be assembled. As described above, the metal solders may be solder materials having melting points from a high temperature to a low temperature in a self-assembly sequence.

Next, as illustrated in (d) of FIG. 18, the process of inspecting whether the green semiconductor light emitting elements 1051 and the blue semiconductor light emitting elements 1053 are coupled to the preset positions of the substrate 1010 is carried out. Furthermore, when the red semiconductor light emitting elements 1051 are self-assembled together with the green semiconductor light emitting elements 1052 and the blue semiconductor light emitting elements 1053, it may also be inspected whether the red semiconductor light emitting elements 1051 are coupled to the preset positions of the substrate 1010.

The inspection may be carried out through identification portions having different shapes so as to be distinguished in a state where the semiconductor light emitting elements are coupled to the substrate. The inspection may be carried out after all the red semiconductor light emitting elements, the green semiconductor light emitting elements, and the blue semiconductor light emitting elements are self-assembled, but the present disclosure is not limited thereto. For example, the inspection may be carried out subsequent to the self-assembly process of the red semiconductor light emitting elements 1051, the green semiconductor light emitting elements 1052, and the blue semiconductor light emitting elements 1053.

The semiconductor light emitting elements assembled at other positions other than the preset positions among the semiconductor light emitting elements may be removed by the inspection. The semiconductor light emitting element that emits light of a color corresponding to the removed vacant space may be self-assembled again, and then the remaining processes such as forming a planarizing layer, and depositing the second electrode may be carried out to implement a display device.

According to the manufacturing method described above, it may be possible to easily check whether the assembled state is normal after each chip is selectively self-assembled using the identification portion, and perform repair before the post-process is carried out, thereby more facilitating the repair.

The configurations and methods according to the above-described embodiments will not be applicable in a limited way to the foregoing display device using a semiconductor light emitting element, and all or part of each embodiment may be selectively combined and configured to make various modifications thereto.

What is the claimed is:

1. A display device, comprising: a substrate having a plurality of metal pads; and green semiconductor light emitting elements and blue semiconductor light emitting elements electrically connected to the metal pads through self-assembly, wherein the green semiconductor light emitting elements and the blue semiconductor light emitting elements have identification portions having different shapes to be distinguished while being coupled to the substrate, wherein the green semiconductor light emitting elements and the blue semiconductor light emitting elements respectively comprise: a conductive semiconductor layer; a conductive electrode formed on one surface of the conductive semiconductor layer; an undoped semiconductor layer; and a passivation layer configured to surround the semiconductor light emitting element, and provided with a through hole through which the conductive electrode is exposed, and wherein the identification portion is formed on the undoped semiconductor layer, wherein grooves are formed in the undoped semiconductor layer of the green semiconductor light emitting elements and the undoped semiconductor layer of the blue semiconductor light emitting elements, and patterns formed with the grooves are different in the green semiconductor light emitting elements and the blue semiconductor light emitting elements.

2. The display device of claim 1, further comprising: a red semiconductor light emitting element electrically connected to the metal pads through self-assembly.

3. The display device of claim 2, wherein the metal pad comprises: first metal solder electrically connected to a conductive electrode of the green semiconductor light emitting elements and second metal solder electrically connected to a conductive electrode of the blue semiconductor light emitting elements.

4. The display device of claim 3, wherein the first metal solder and the second metal solder are formed of materials having different melting points.

5. The display device of claim 4, wherein the metal pad further comprises: third metal solder electrically connected to a conductive electrode of the red semiconductor light emitting element, and the third metal solder is formed of a material having a melting point different from that of at least one of the first metal solder and the second metal solder.

6. The display device of claim 1, wherein the shape of the conductive semiconductor layers may be an overall shape of the green semiconductor light emitting elements and the blue semiconductor light emitting elements.

7. The display device according to claim 6, wherein the shapes comprise circular and hexagonal shapes.

8. A method of manufacturing a display device, the method comprising: growing green semiconductor light emitting elements and blue semiconductor light emitting elements separately on a growth substrate to grow light emitting structures of the green semiconductor light emitting elements and the blue semiconductor light emitting elements; separating the green semiconductor light emitting elements and the blue semiconductor light emitting elements from the growth substrate, and sequentially coupling them to a substrate through self-assembly in a chamber filled with a fluid, and inspecting whether the green semiconductor light emitting elements and the blue semiconductor light emitting elements are coupled to the preset positions of the substrate, wherein the green semiconductor light emitting elements and the blue semiconductor light emitting elements have identification portions having different shapes to be distinguished while being coupled to the substrate, wherein the green semiconductor light emitting elements and the blue semiconductor light emitting elements respectively comprise: a conductive semiconductor layer; a conductive electrode formed on one surface of the conductive semiconductor layer; an undoped semiconductor layer; and a passivation layer configured to surround the semiconductor light emitting element, and provided with a through hole through which the conductive electrode is exposed, and wherein the identification portion is formed on the undoped semiconductor layer, wherein grooves are formed in the undoped semiconductor layer of the green semiconductor light emitting elements and the undoped semiconductor layer of the blue semiconductor light emitting elements, and patterns formed with the grooves are different in the green semiconductor light emitting elements and the blue semiconductor light emitting elements.

9. The method of claim 8, wherein the green semiconductor light emitting elements and the blue semiconductor light emitting elements are respectively coupled to first metal solder and second metal solder applied to the wiring electrodes of the substrate through soldering.

10. The method of claim 9, wherein the first metal solder and the second metal solder have high melting points in the order of the self-assembly.

* * * * *